(12) United States Patent
Han et al.

(10) Patent No.: US 8,648,423 B2
(45) Date of Patent: Feb. 11, 2014

(54) SEMICONDUCTOR DEVICES INCLUDING BURIED-CHANNEL-ARRAY TRANSISTORS

(75) Inventors: Sung-Hee Han, Hwaseong-si (KR); Soo-Ho Shin, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 16 days.

(21) Appl. No.: 13/239,461

(22) Filed: Sep. 22, 2011

(65) Prior Publication Data

US 2012/0091532 A1  Apr. 19, 2012

(30) Foreign Application Priority Data

Oct. 18, 2010 (KR) .................. 10-2010-0101494

(51) Int. Cl.
   *H01L 23/48* (2006.01)
   *H01L 27/088* (2006.01)
   *H01L 27/108* (2006.01)

(52) U.S. Cl.
   CPC .... *H01L 27/10888* (2013.01); *H01L 27/10885* (2013.01)
   USPC .................. 257/368; 257/774; 257/E27.088; 257/E21.568

(58) Field of Classification Search
   CPC .................. H01L 27/10885; H01L 27/10888
   USPC ............ 257/288, 345, 368, E21.205, E21.64, 257/E21.626, E21.657, E21.658, E29.27; 438/197, 218, 233, 303, 396, 637, 638, 438/589
   See application file for complete search history.

(56) References Cited

U.S. PATENT DOCUMENTS

| | | | |
|---|---|---|---|
| 7,411,240 B2 * | 8/2008 | Park et al. | 257/306 |
| 7,462,899 B2 * | 12/2008 | Seo et al. | 257/296 |
| 2001/0035551 A1 * | 11/2001 | Kotecki et al. | 257/306 |
| 2004/0262769 A1 * | 12/2004 | Park | 257/758 |
| 2005/0014338 A1 * | 1/2005 | Kim et al. | 438/275 |
| 2006/0138561 A1 * | 6/2006 | Seo et al. | 257/382 |
| 2010/0085800 A1 * | 4/2010 | Yeom | 365/149 |
| 2011/0221010 A1 * | 9/2011 | Baek et al. | 257/401 |
| 2011/0233636 A1 * | 9/2011 | Cho et al. | 257/314 |
| 2011/0260238 A1 * | 10/2011 | Kim | 257/330 |
| 2012/0217584 A1 * | 8/2012 | Kutsukake et al. | 257/368 |

FOREIGN PATENT DOCUMENTS

| | | |
|---|---|---|
| KR | 100780618 (B1) | 11/2007 |
| KR | 1020090008034 (A) | 1/2009 |
| KR | 102009021765 (A) | 3/2009 |

* cited by examiner

*Primary Examiner* — Tom Thomas
*Assistant Examiner* — John Bodnar
(74) *Attorney, Agent, or Firm* — Myers Bigel Sibley & Sajovec, P.A.

(57) ABSTRACT

Provided is a semiconductor device in which a short margin between a storage contact plug and a bit line contact plug may be increased. The device includes a substrate including isolation regions and active regions defined by the isolation regions, gates disposed in the substrate and configured to intersect the active regions and define source regions and drain regions in the active regions, an interlayer insulating layer disposed on the substrate, bit line contact plugs configured to penetrate the interlayer insulating layer and contact the drain regions, and first bit line structures and second bit line structures disposed on the interlayer insulating layer. The first bit line structures include first bit line conductive patterns and first bit line spacers covering sidewalls of the first bit line conductive patterns. The second bit line structures include second bit line conductive patterns configured to contact the bit line contact plugs to be substantially parallel to the first bit line conductive patterns and first bit line spacers covering sidewalls of the second bit line conductive patterns and sidewalls of the bit line contact plugs.

19 Claims, 45 Drawing Sheets

FIG. 2
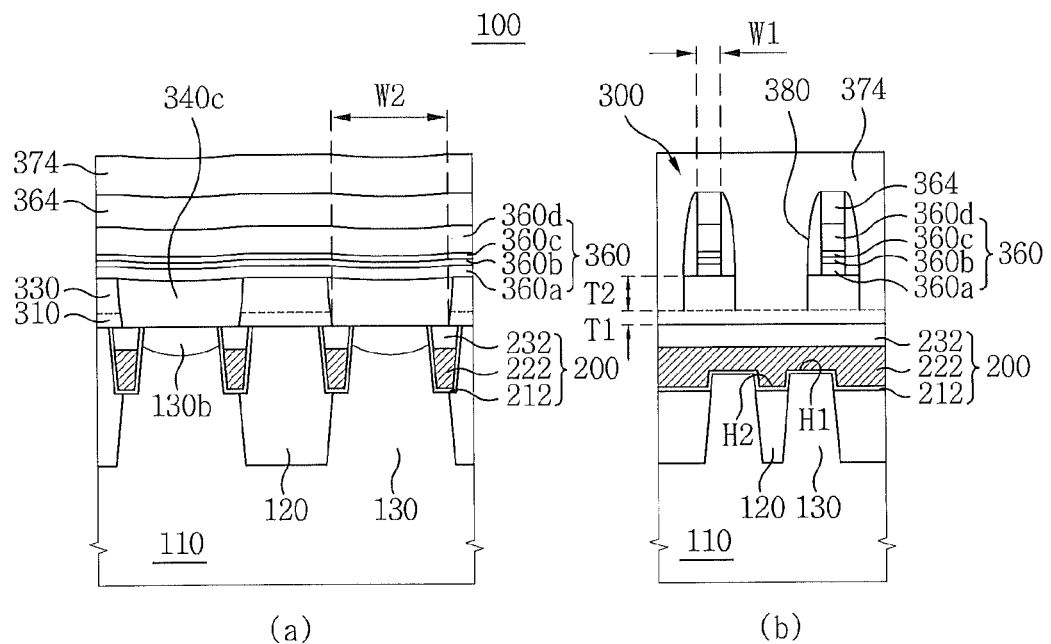
(a)　　　(b)
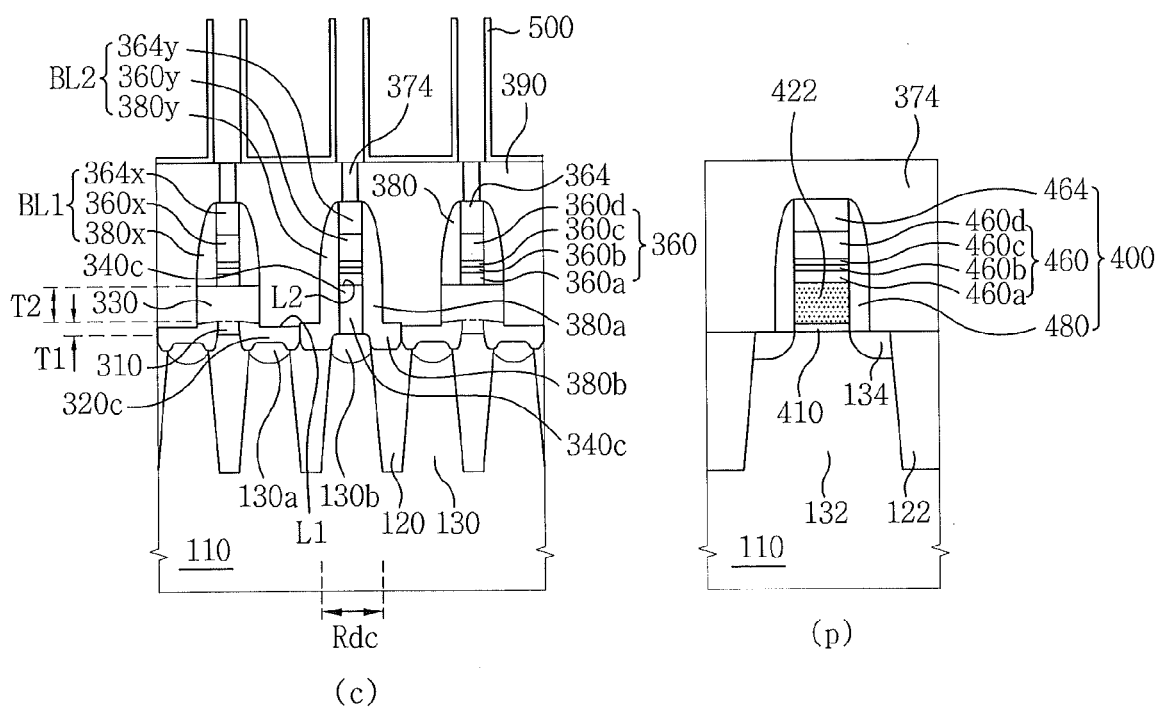
(c)　　　(p)

FIG. 3A
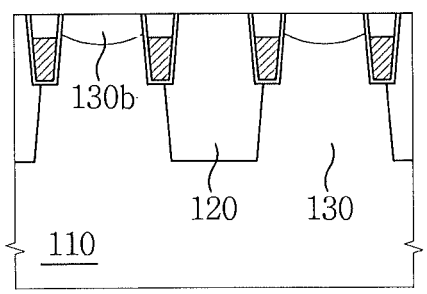
(a)
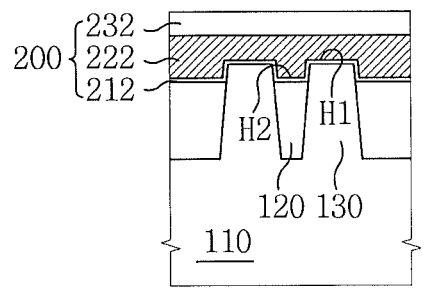
(b)
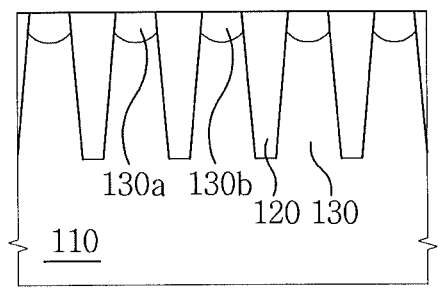
(c)

FIG. 3B
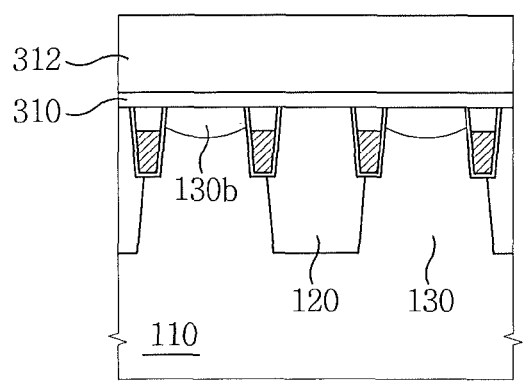
(a)
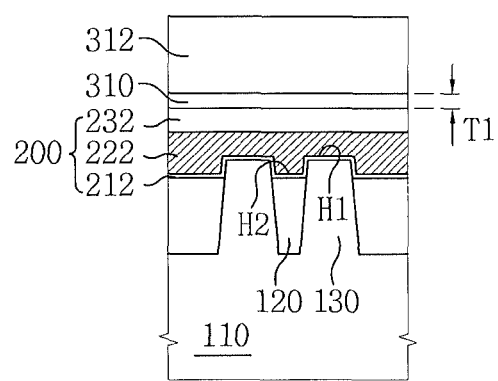
(b)
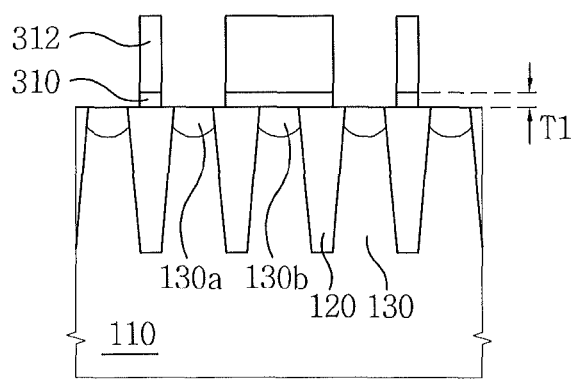
(c)

FIG. 3C
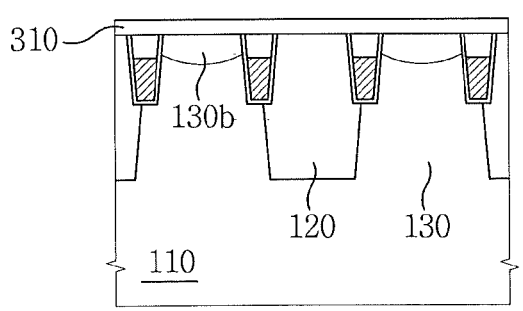
(a)
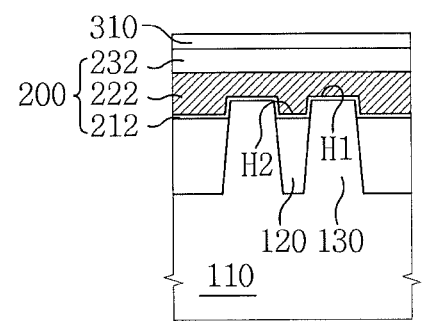
(b)
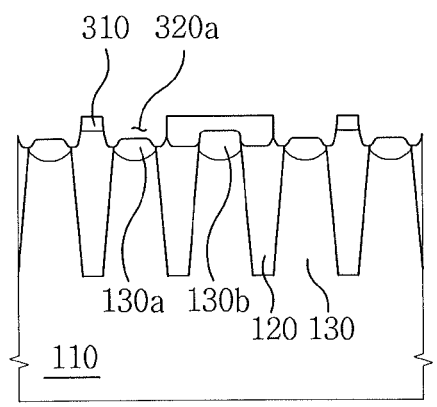
(c)

FIG. 3D
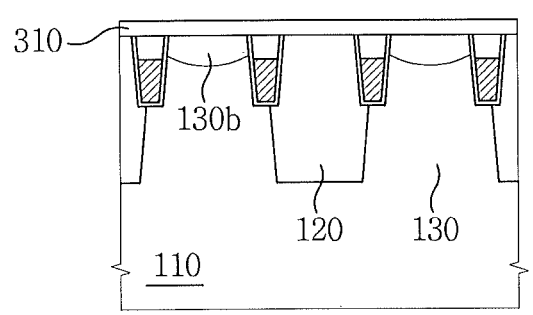
(a)
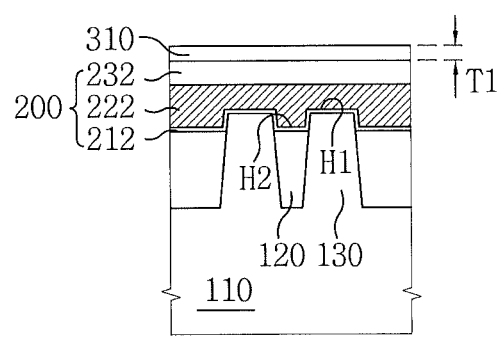
(b)
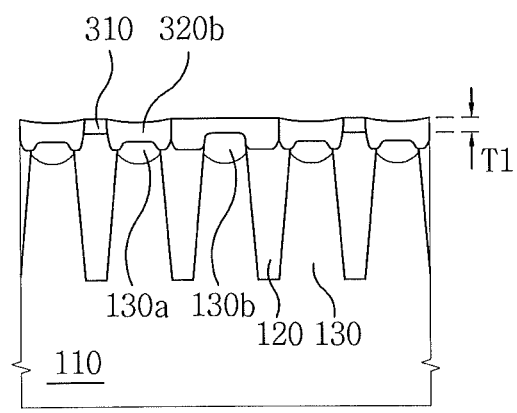
(c)

FIG. 3E
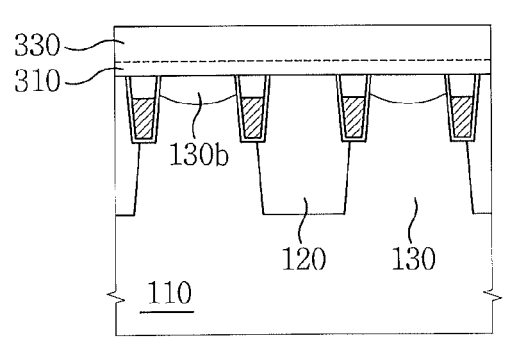
(a)
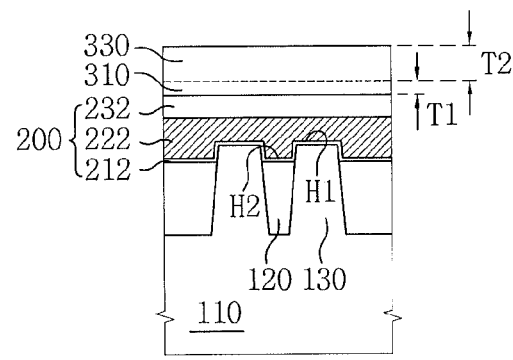
(b)
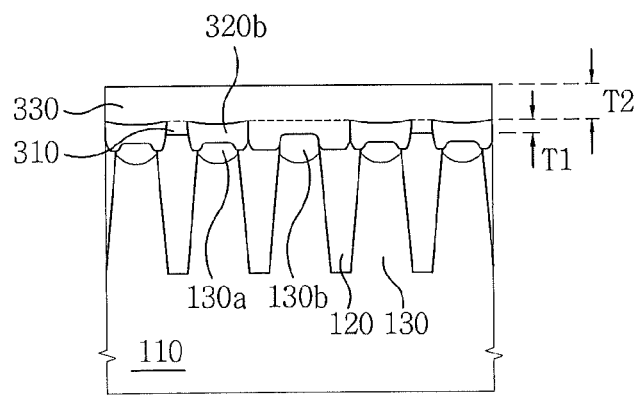
(c)

FIG. 3F
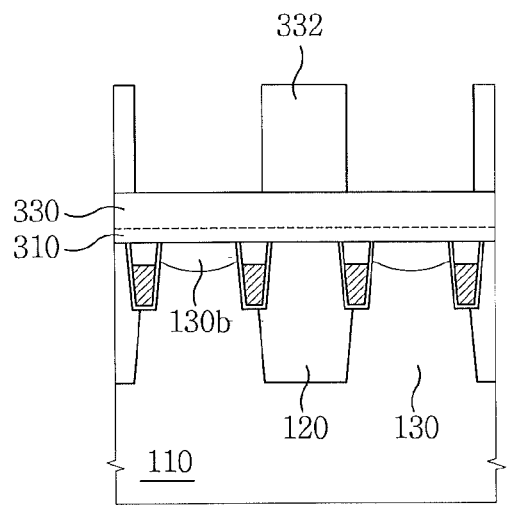
(a)
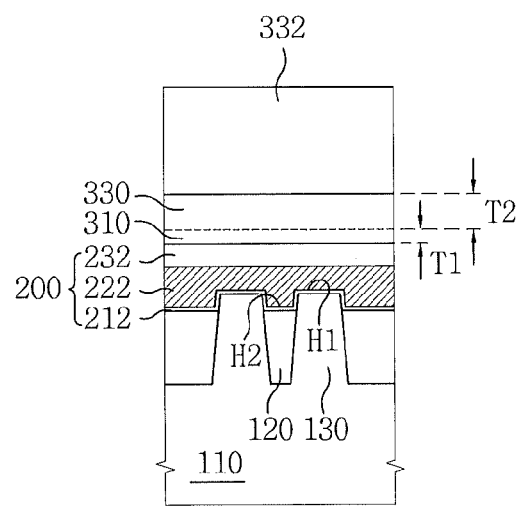
(b)
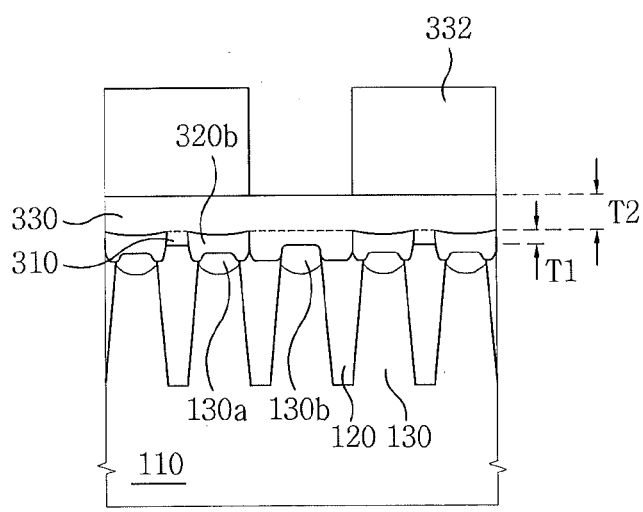
(c)

FIG. 3G
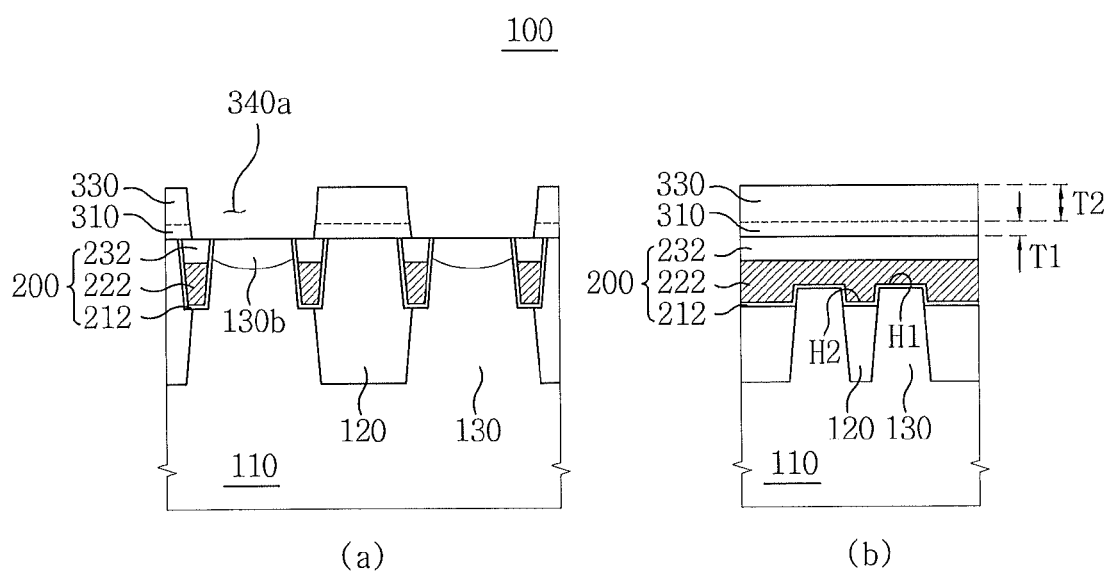
(a)  (b)
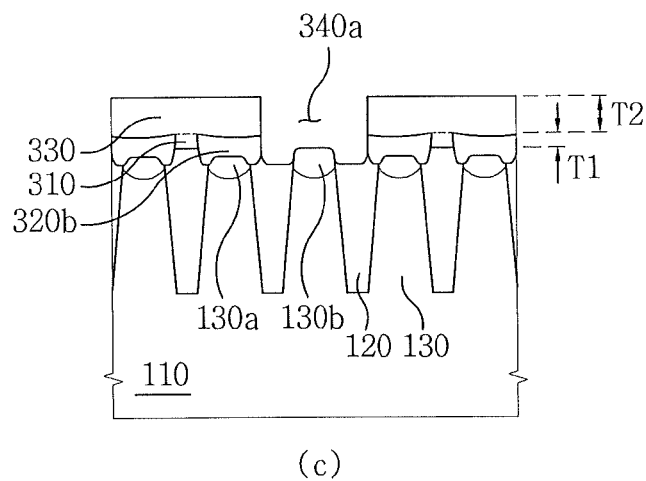
(c)

FIG. 3H
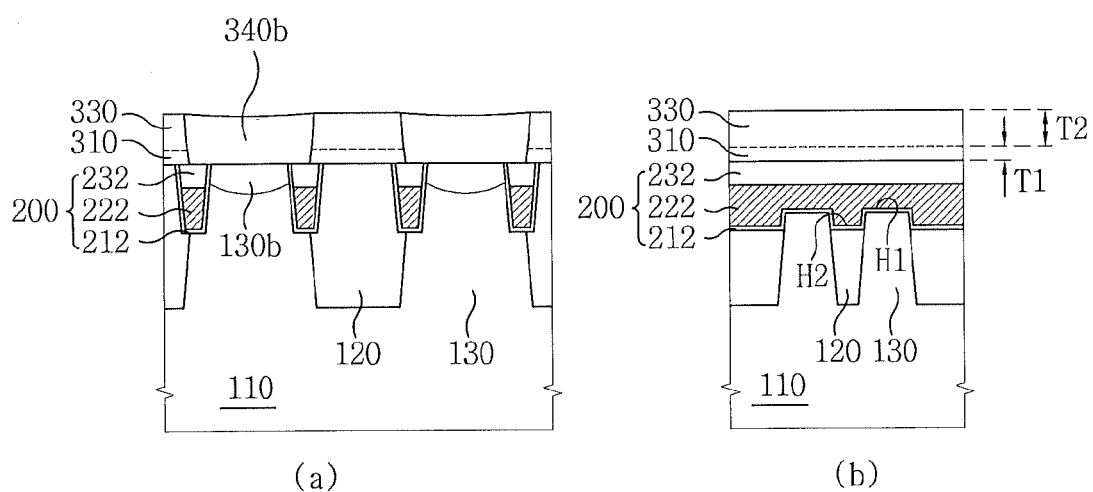
(a)   (b)
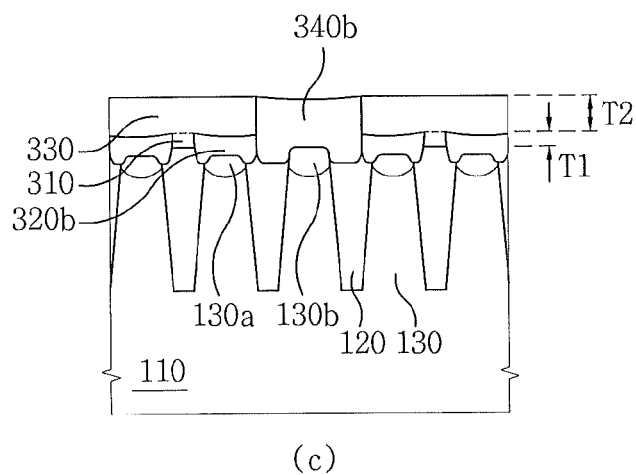
(c)

FIG. 3I
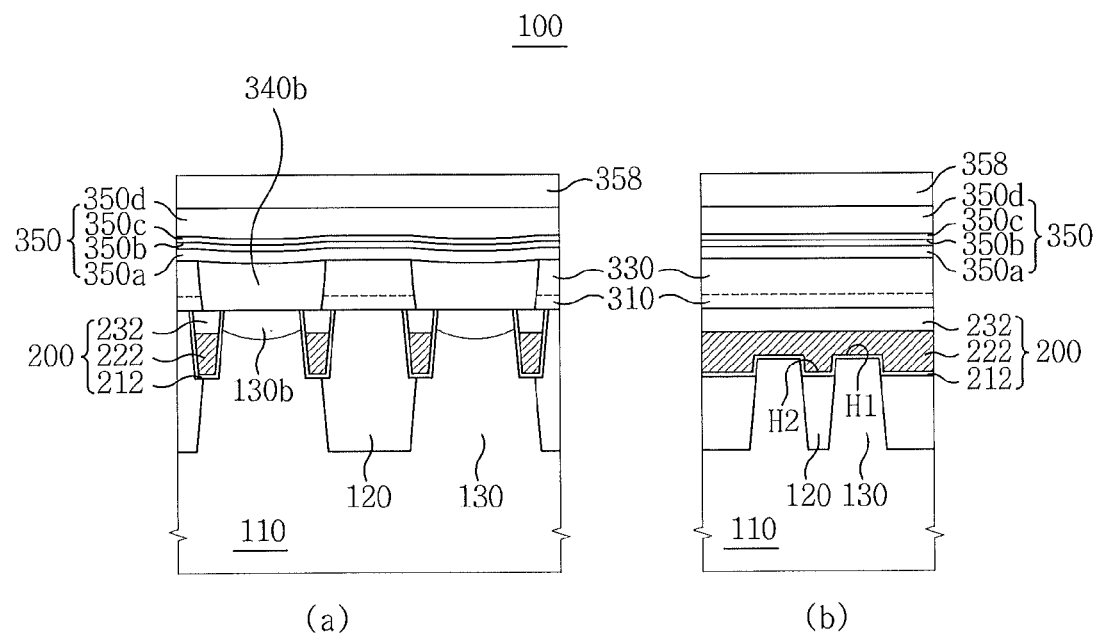
(a)  (b)
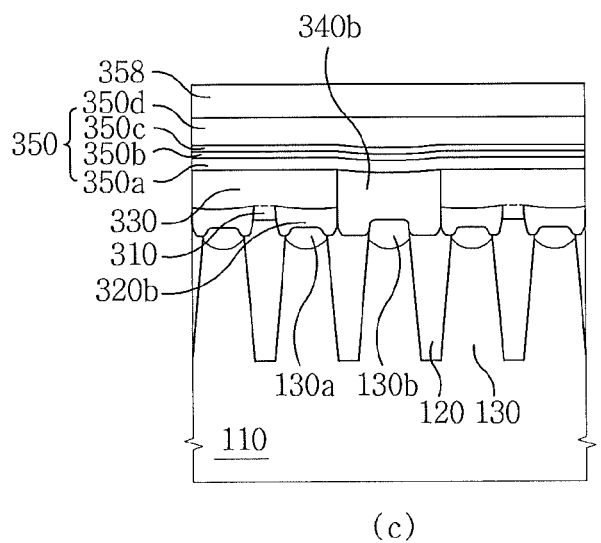
(c)

FIG. 3K
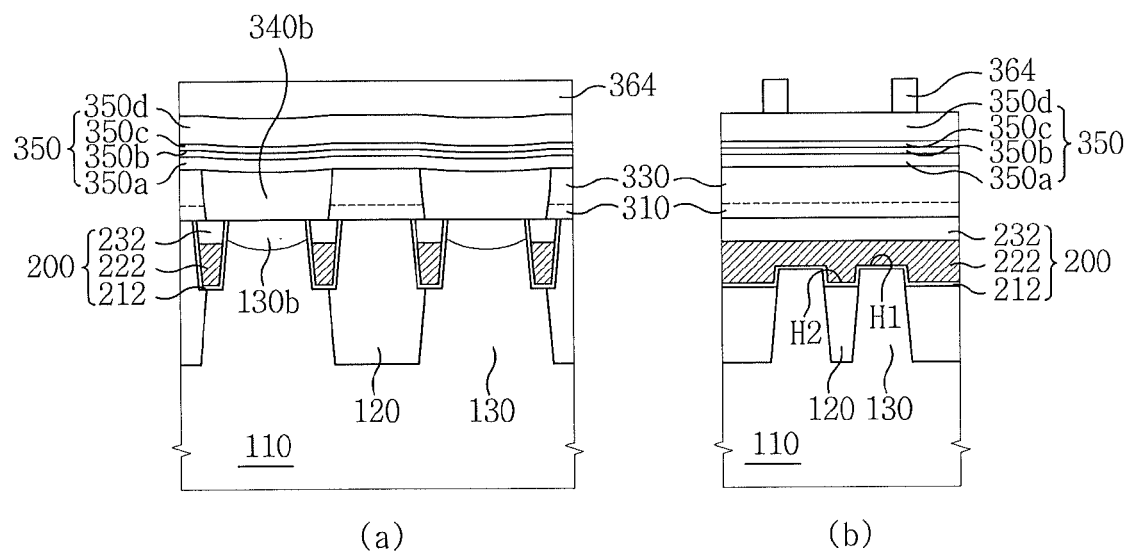
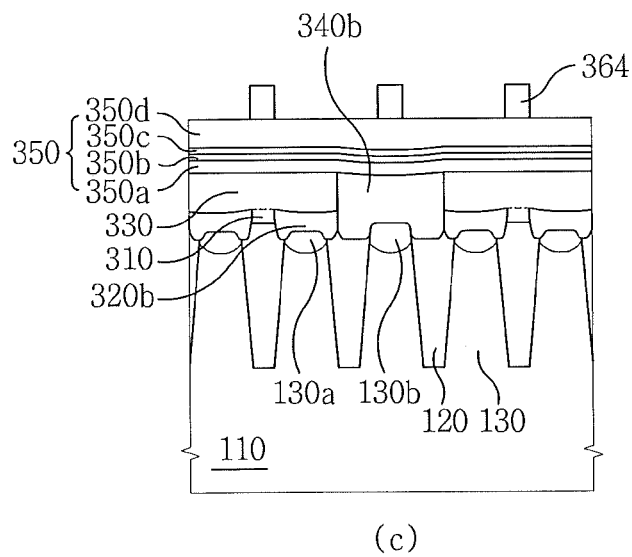

FIG. 3L
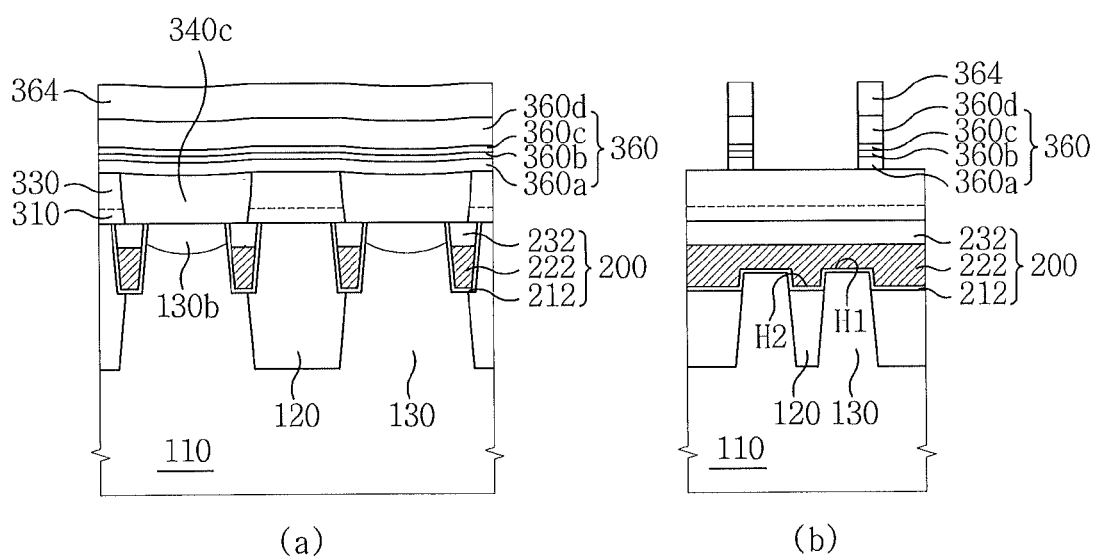
(a)  (b)
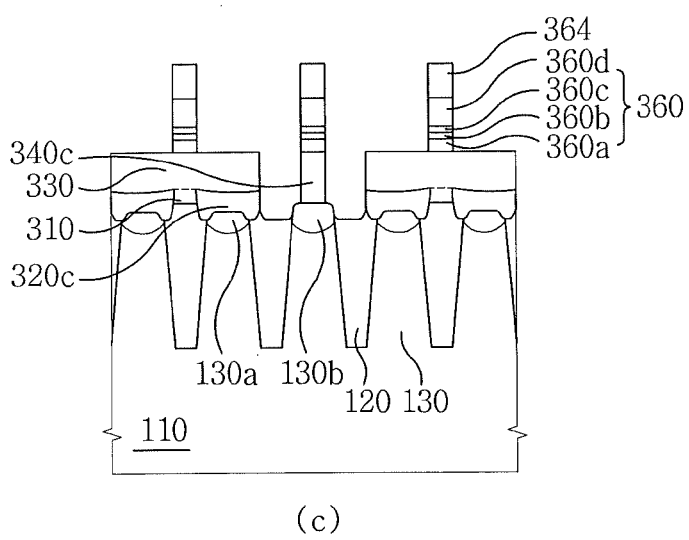
(c)

FIG. 3M
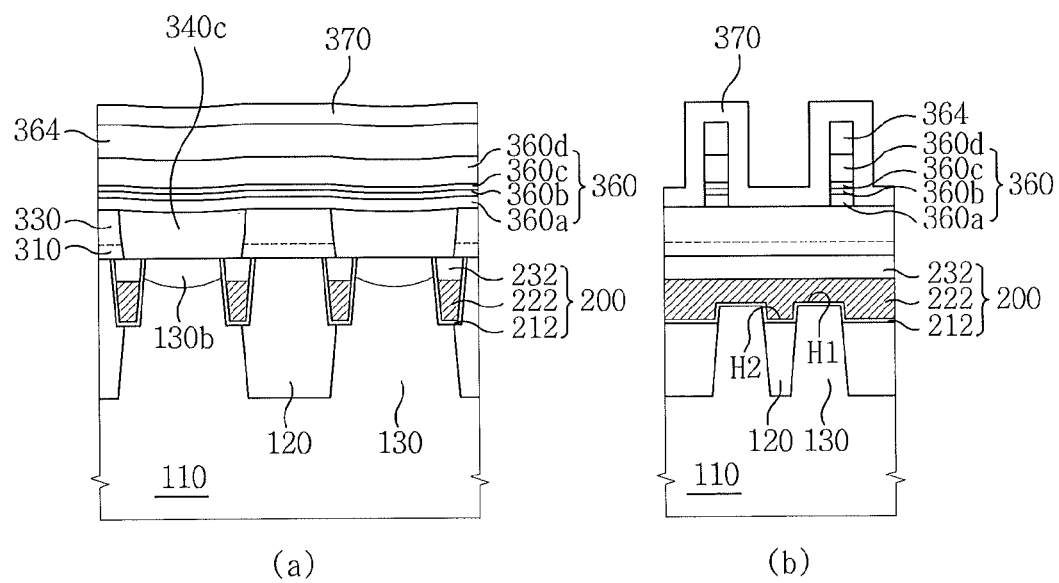
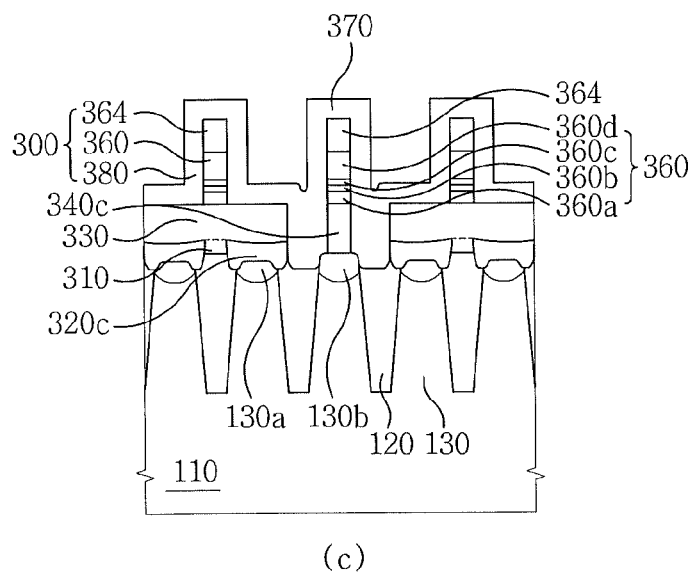

FIG. 3N
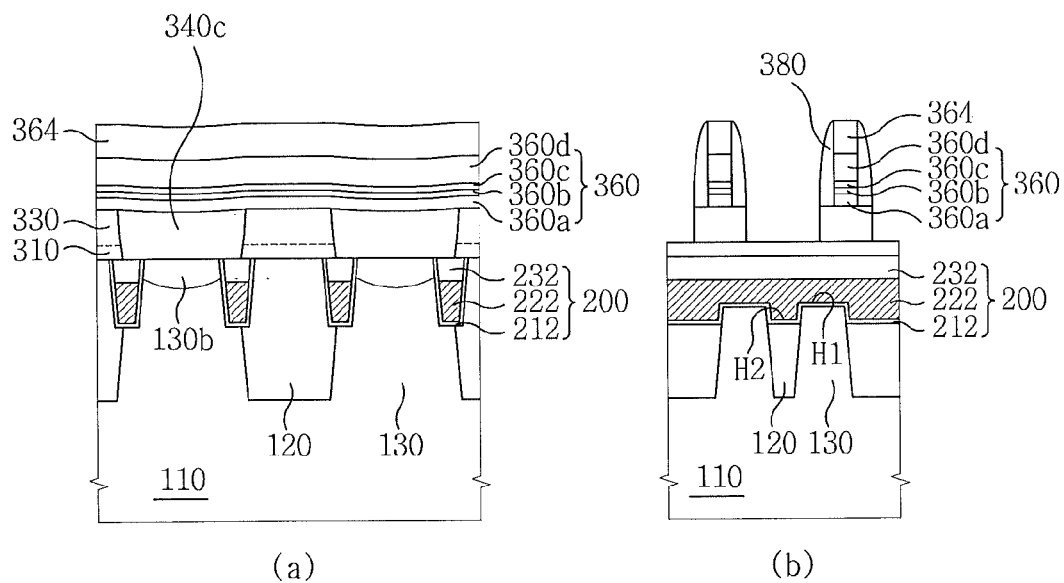
(a)  (b)
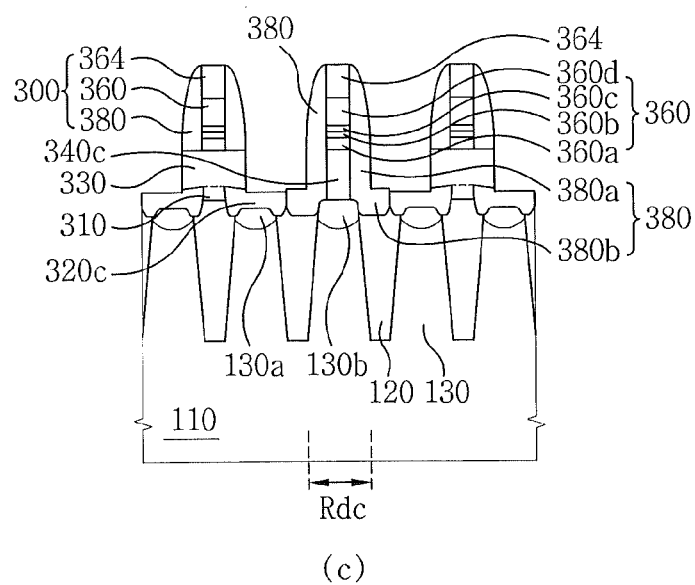
(c)

FIG. 30
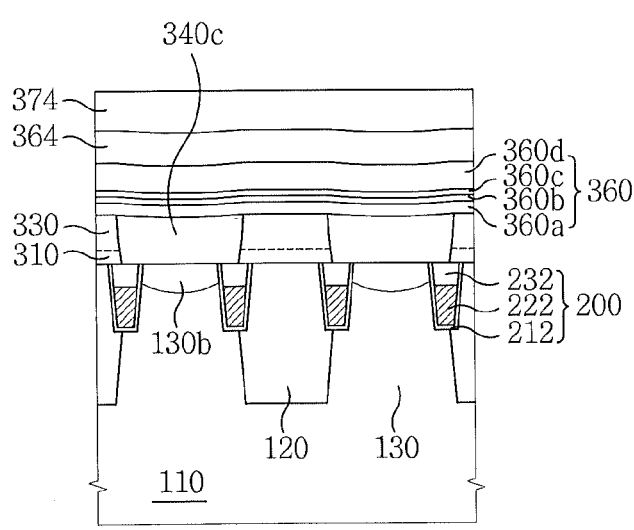
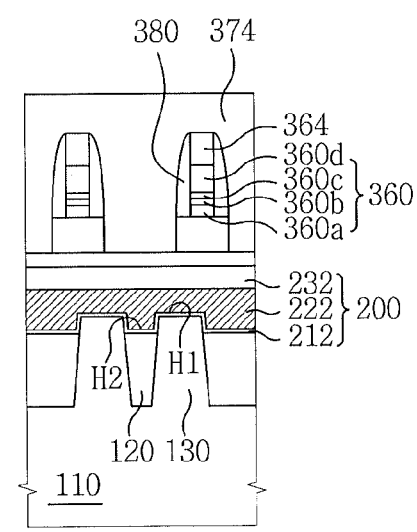
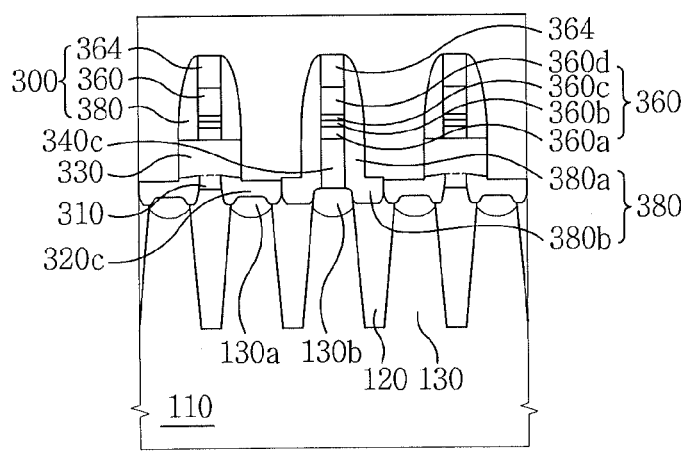

FIG. 3P
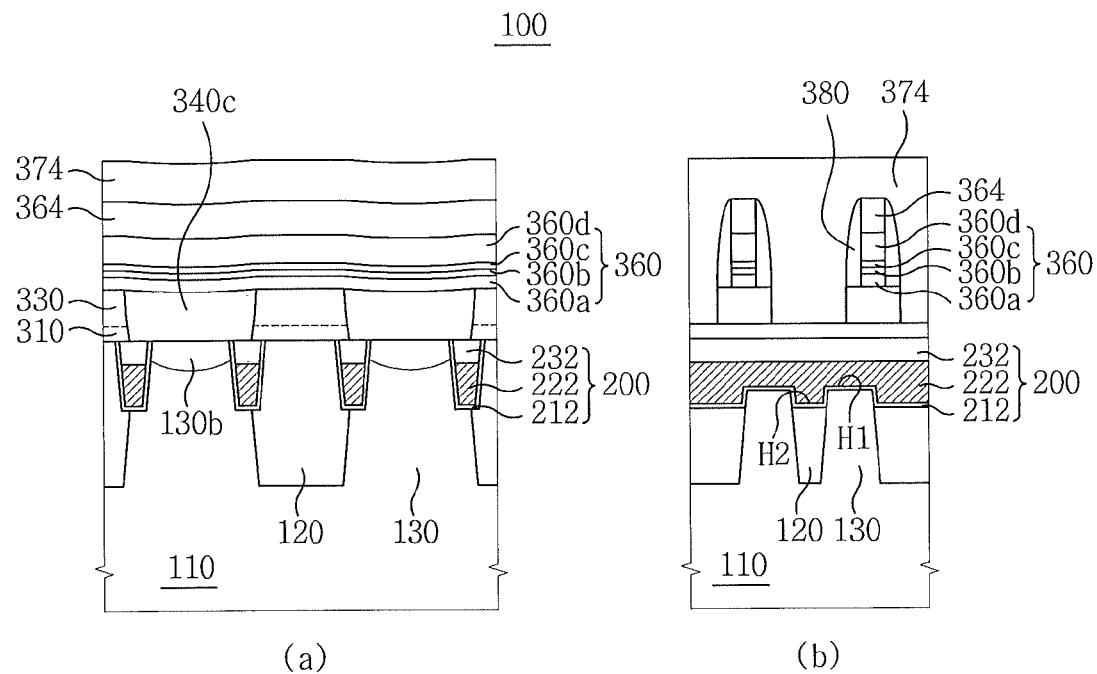
(a)    (b)
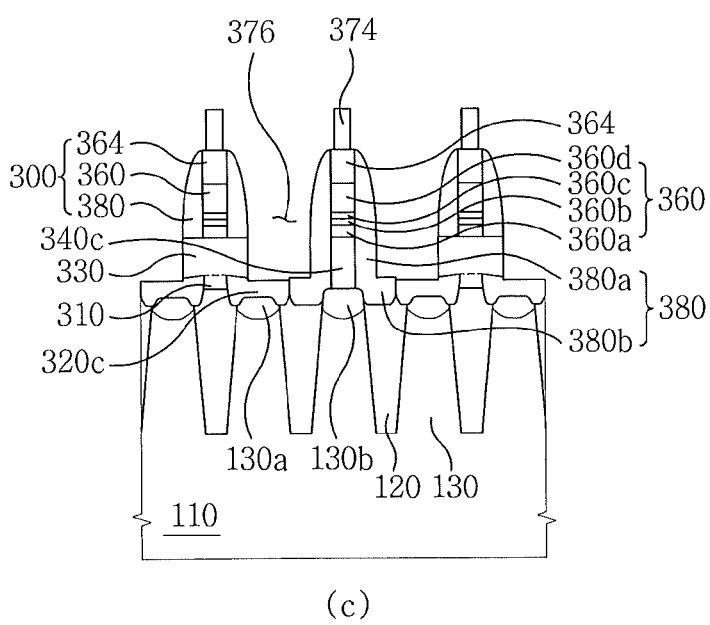
(c)

FIG. 3Q
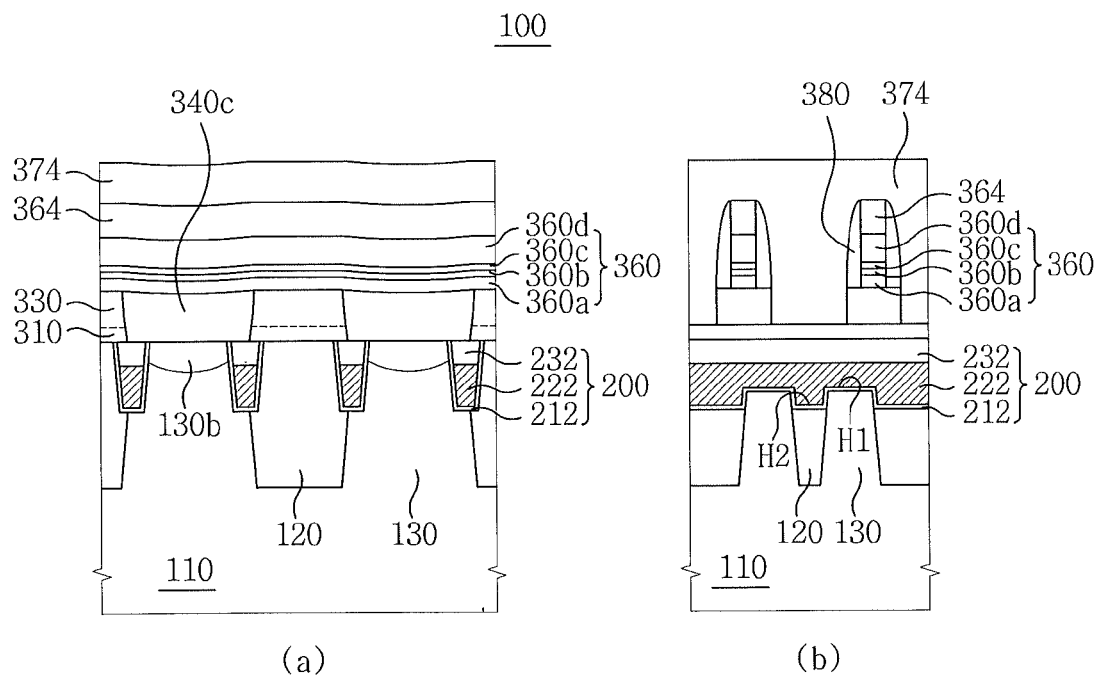
(a)  (b)
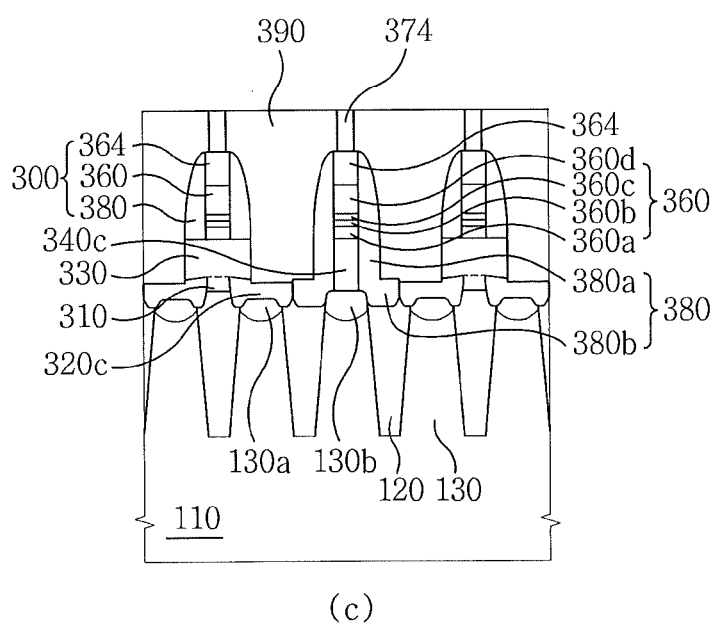
(c)

FIG. 4A
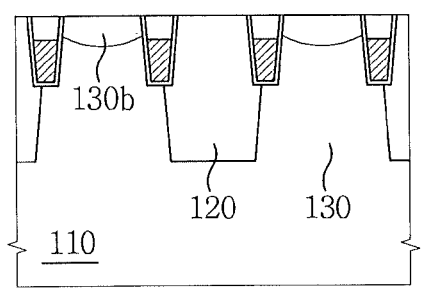
(a)
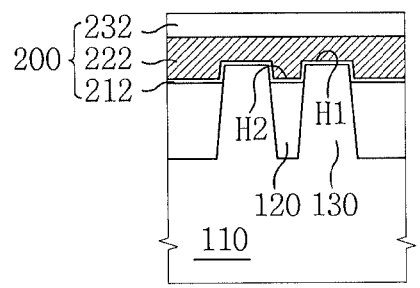
(b)
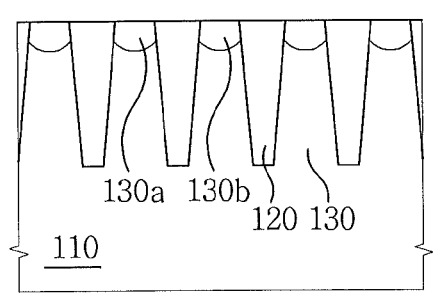
(c)
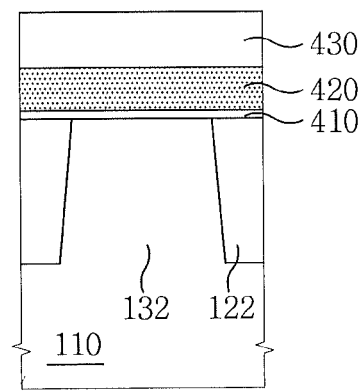
(p)

FIG. 4B
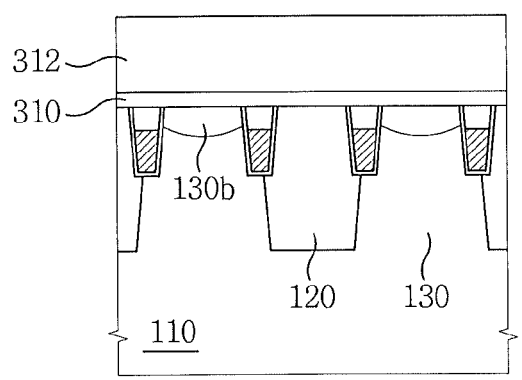
(a)
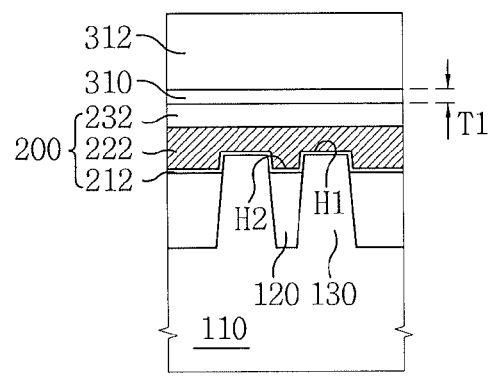
(b)
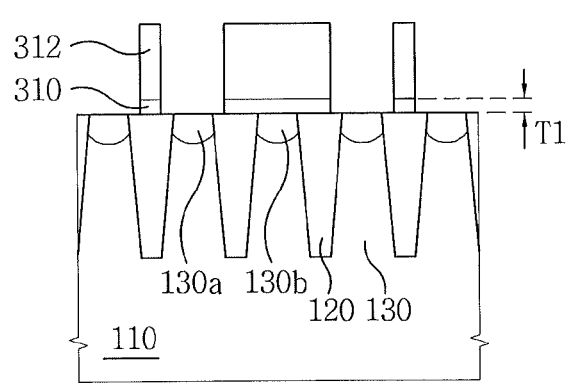
(c)
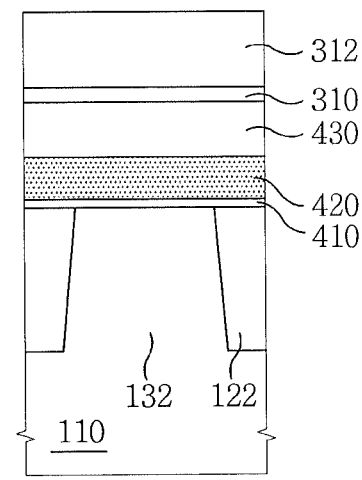
(p)

FIG. 4C
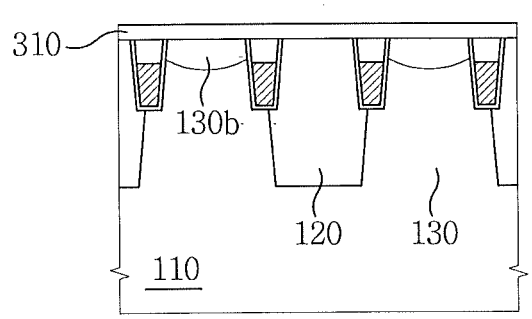
(a)
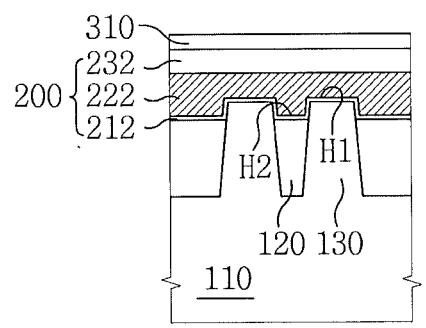
(b)
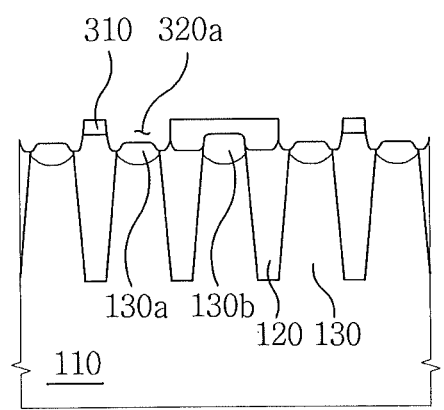
(c)
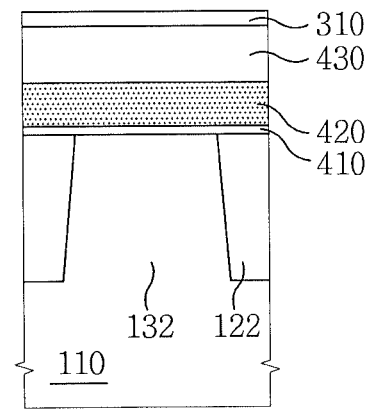
(p)

FIG. 4D
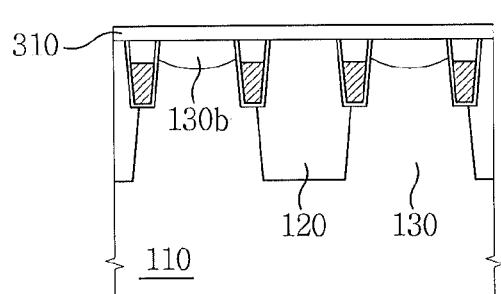
(a)
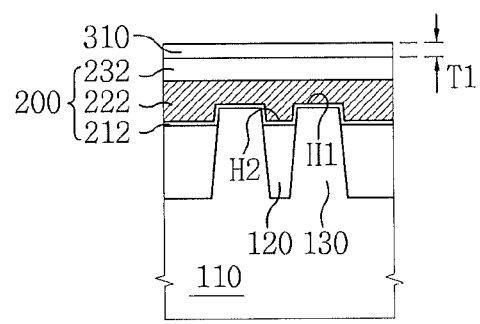
(b)
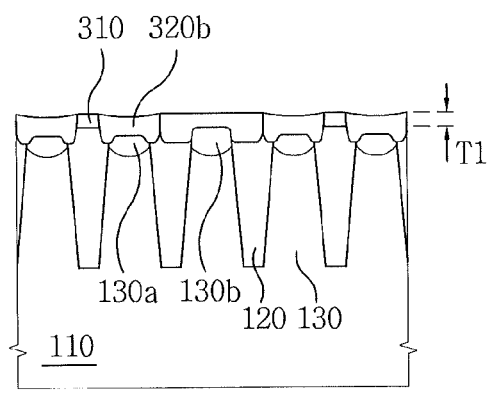
(c)
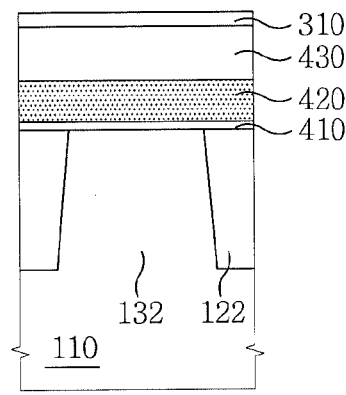
(p)

FIG. 4E
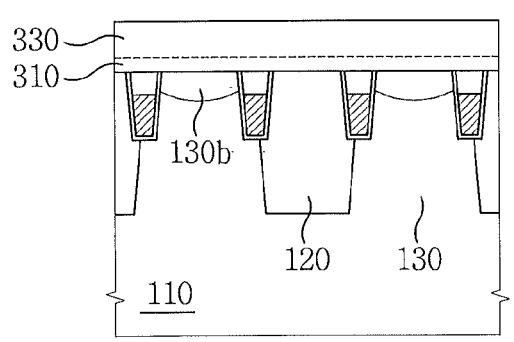
(a)
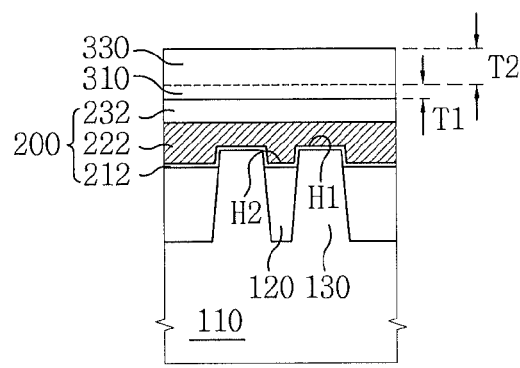
(b)
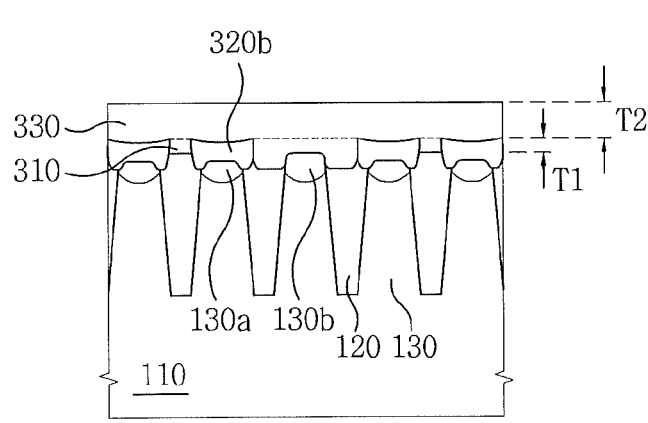
(c)
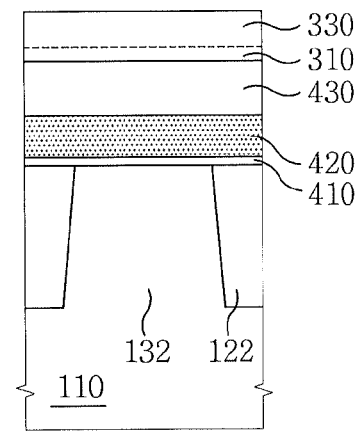
(p)

FIG. 4F
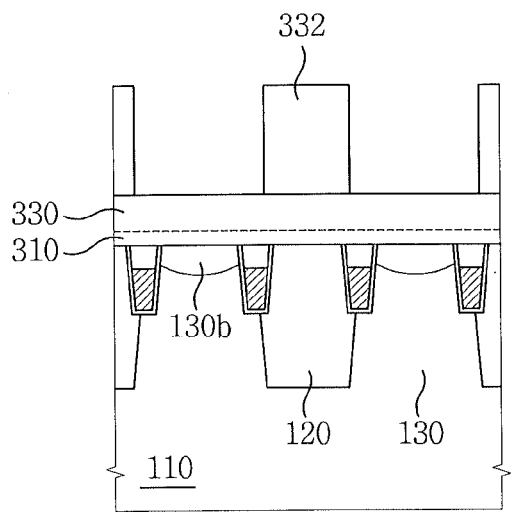
(a)
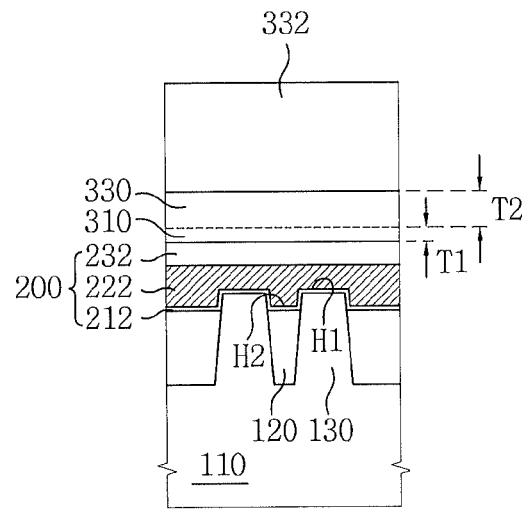
(b)
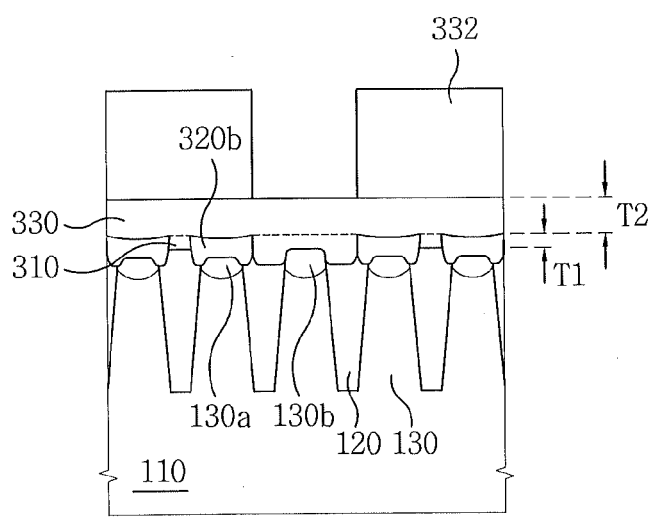
(c)
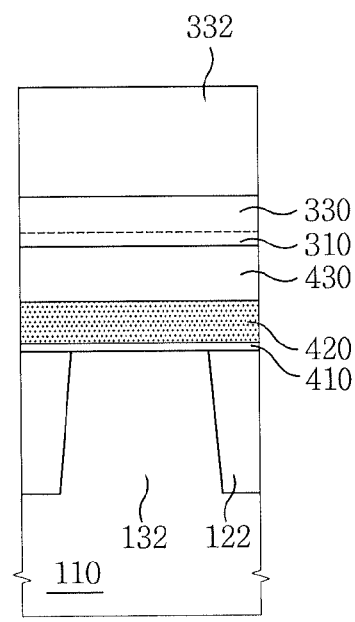
(p)

FIG. 4G
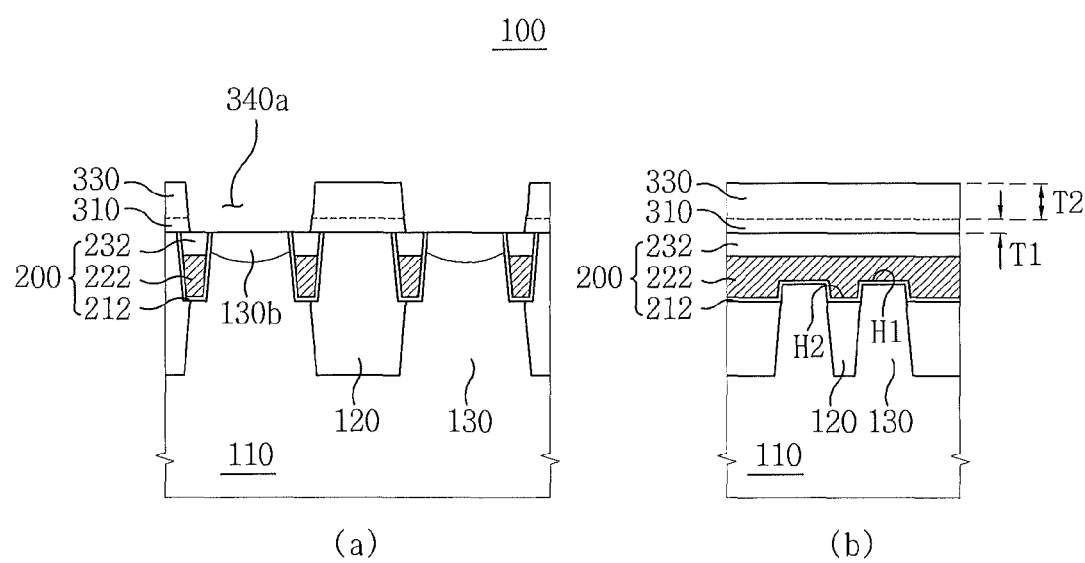
(a)   (b)
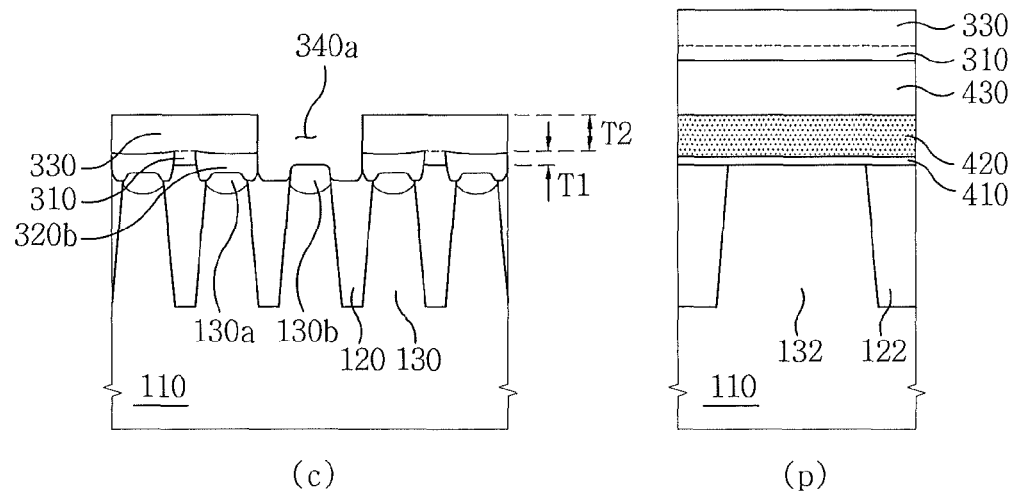
(c)   (p)

FIG. 4H
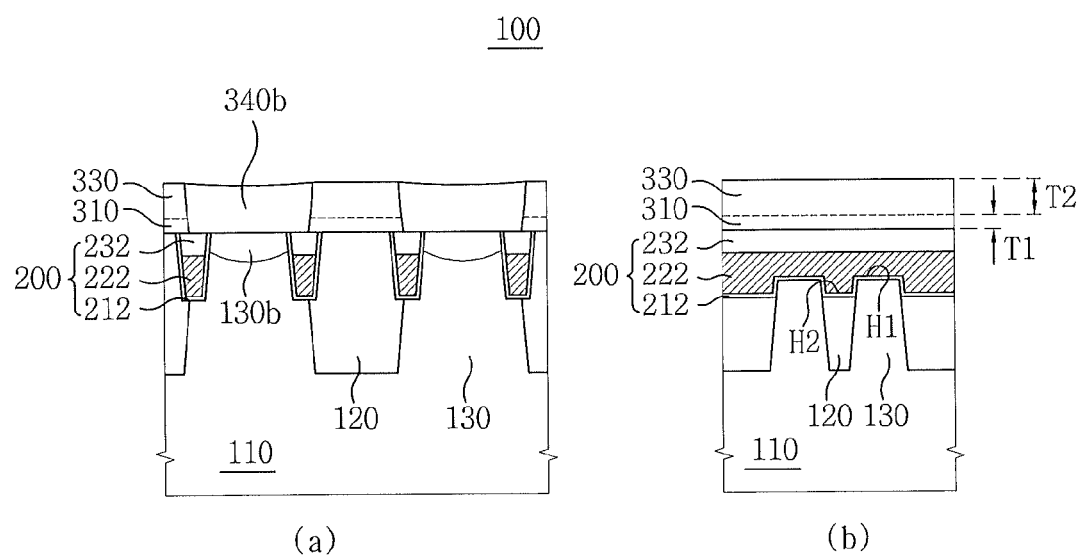
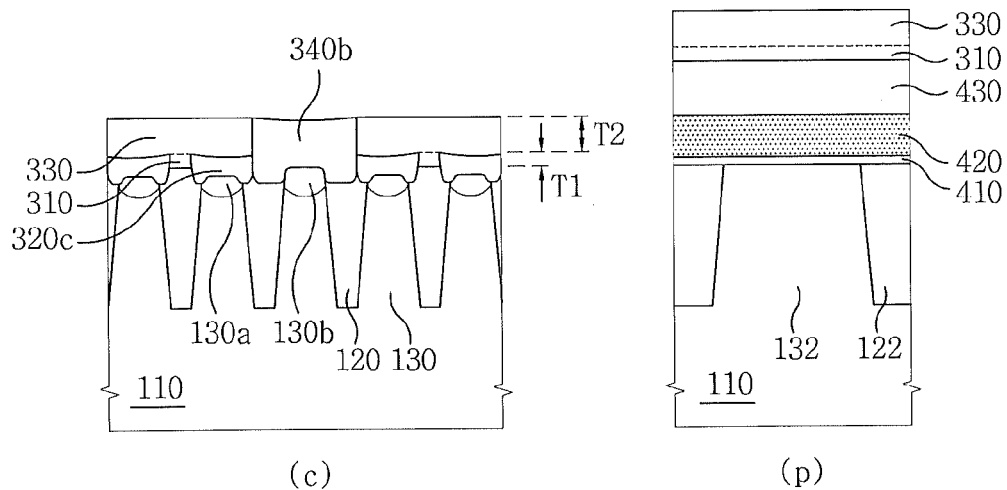

FIG. 4J
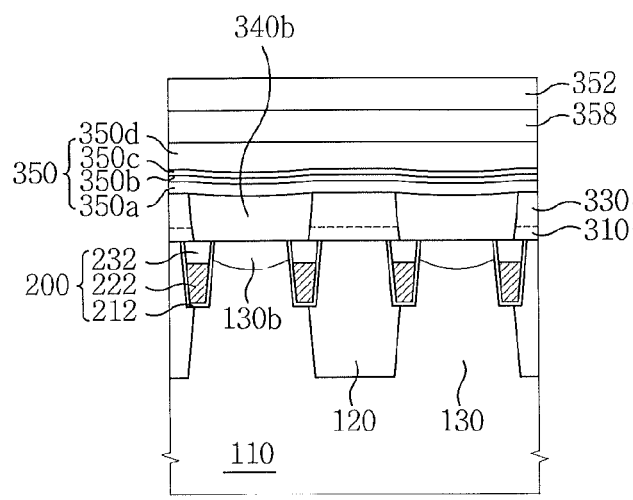
(a)
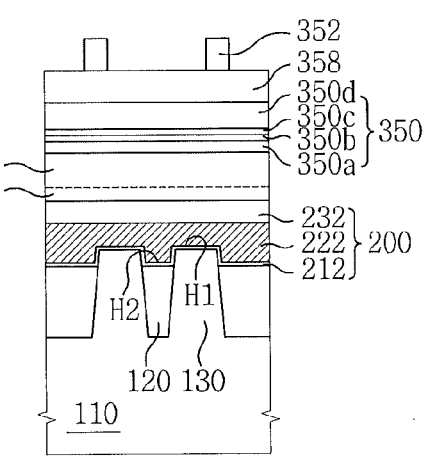
(b)
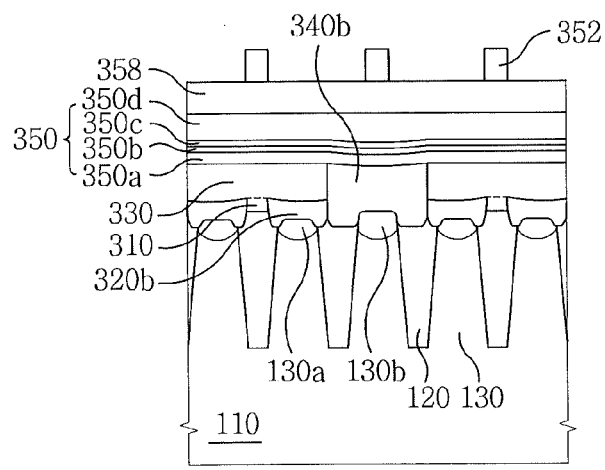
(c)
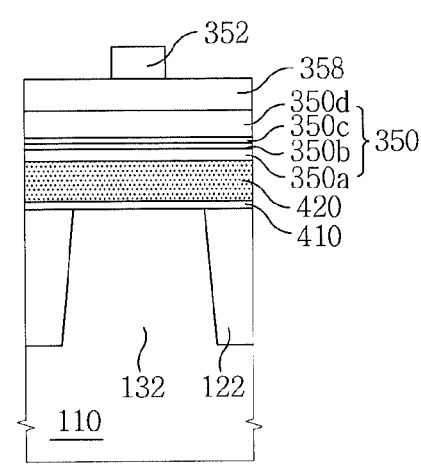
(p)

FIG. 4K
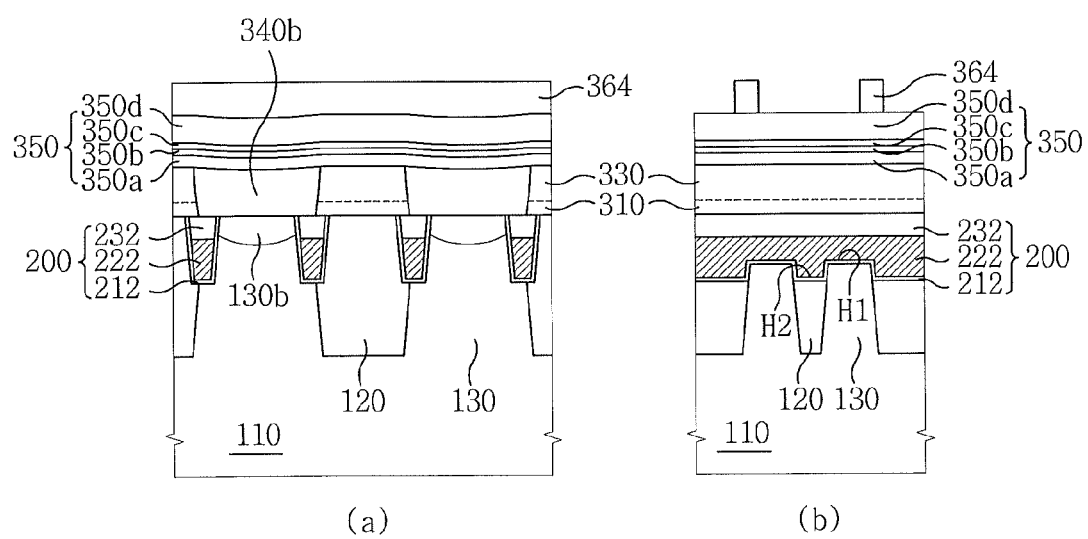
(a)  (b)
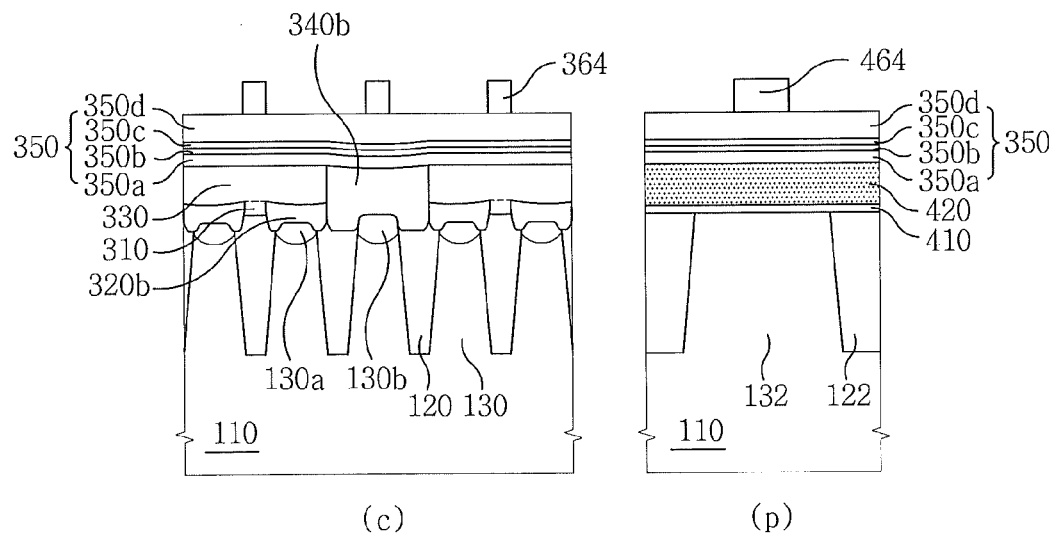
(c)  (p)

FIG. 4L
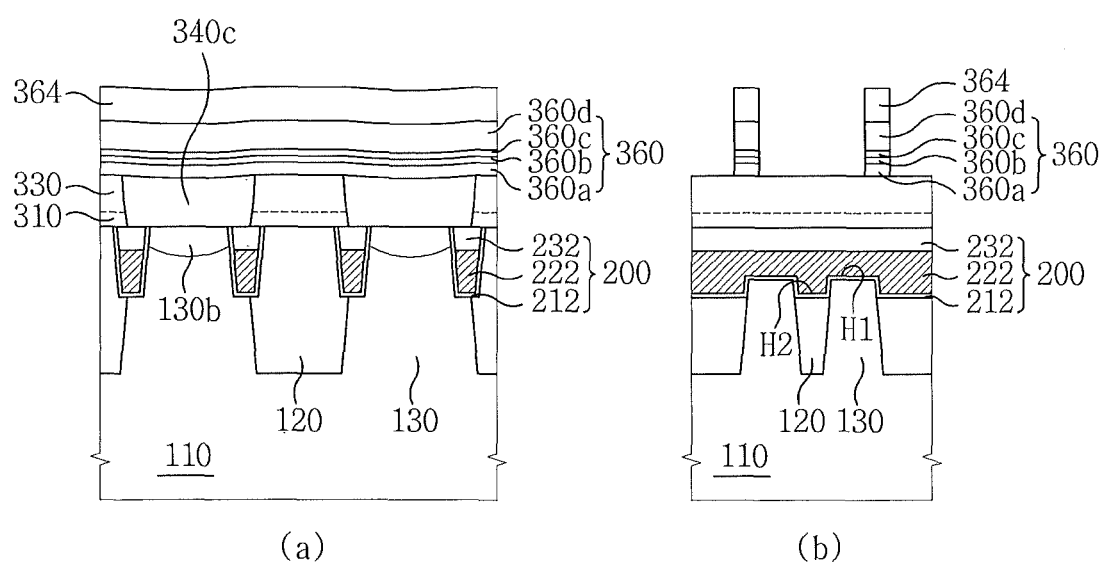
(a)  (b)
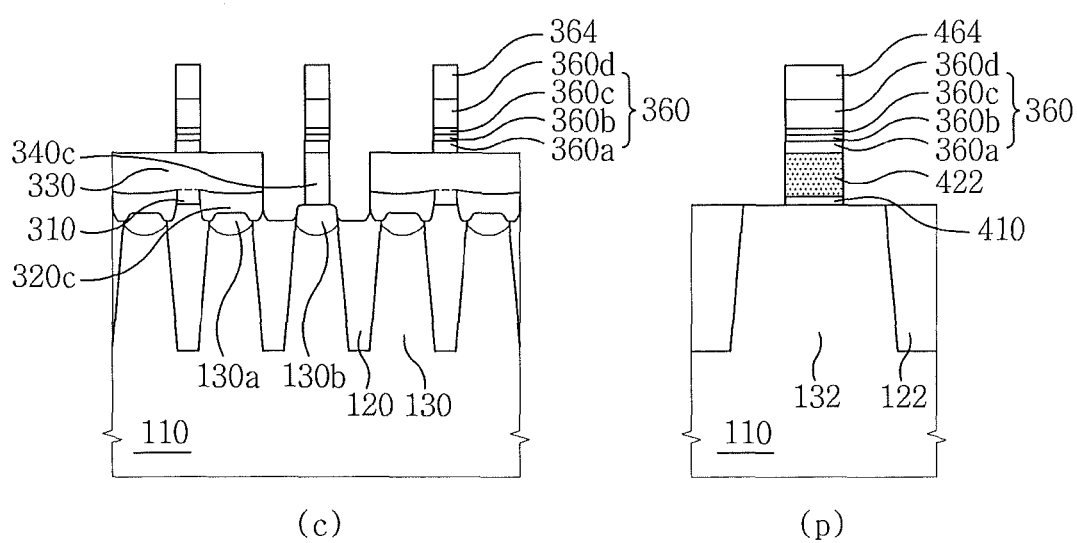
(c)  (p)

FIG. 4M
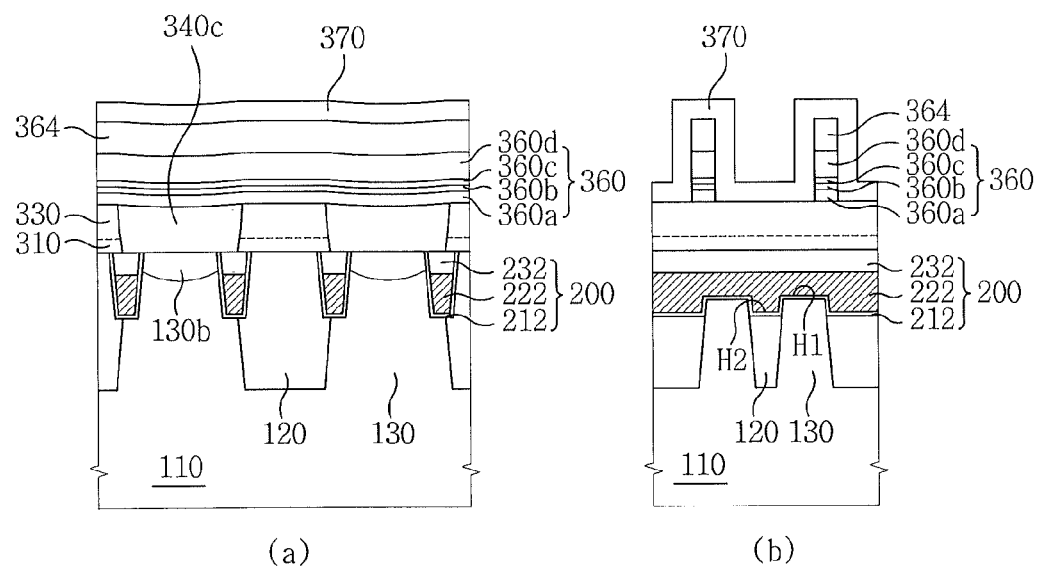
(a) (b)
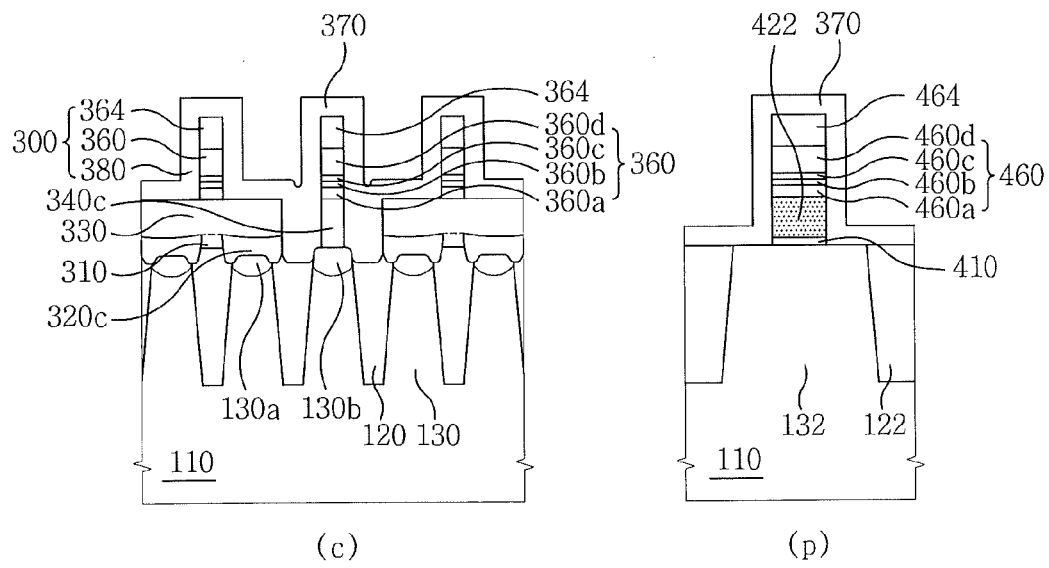
(c) (p)

FIG. 4N
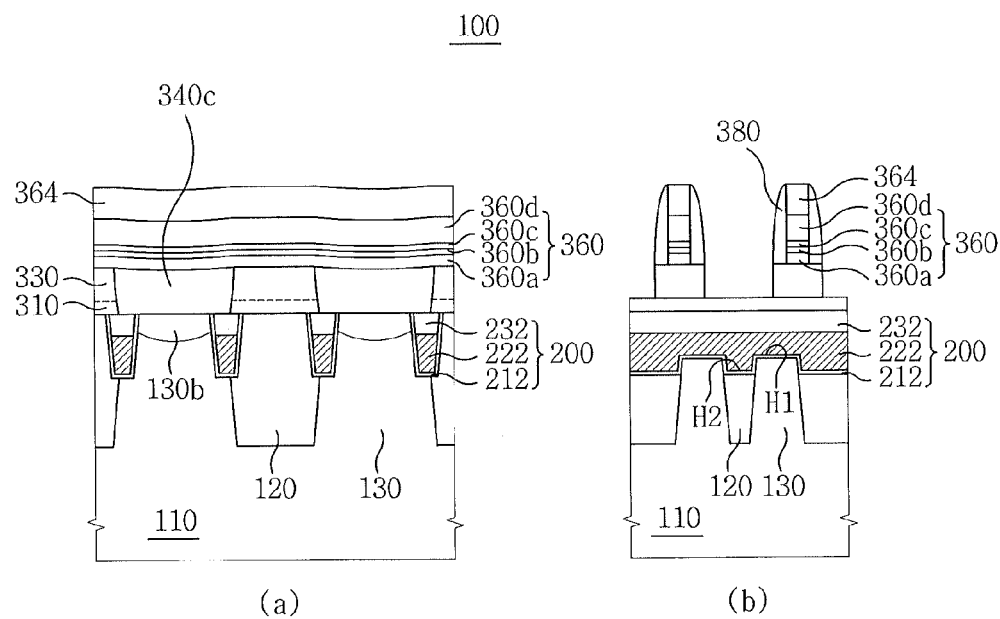
(a)   (b)
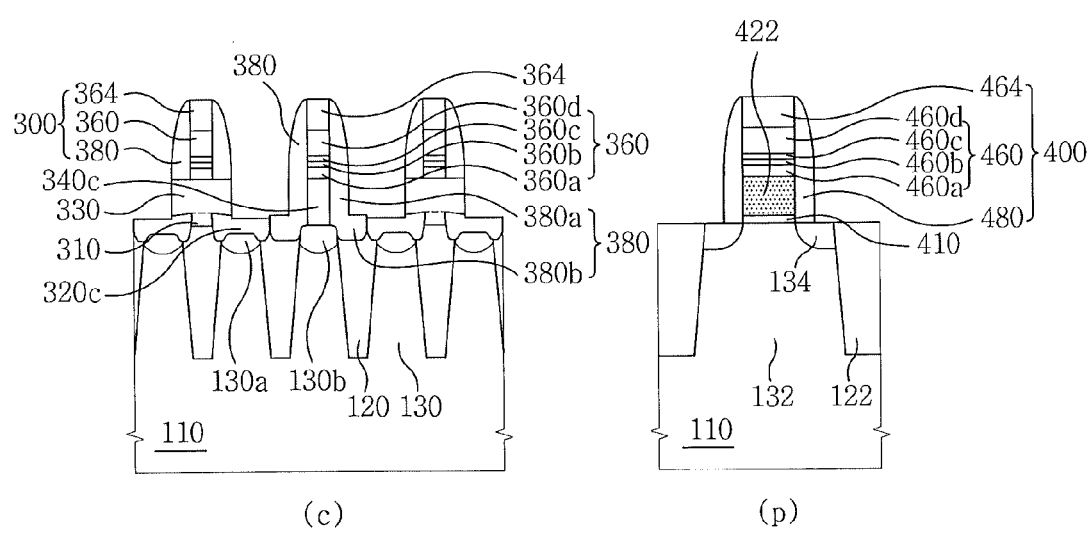
(c)   (p)

FIG. 40
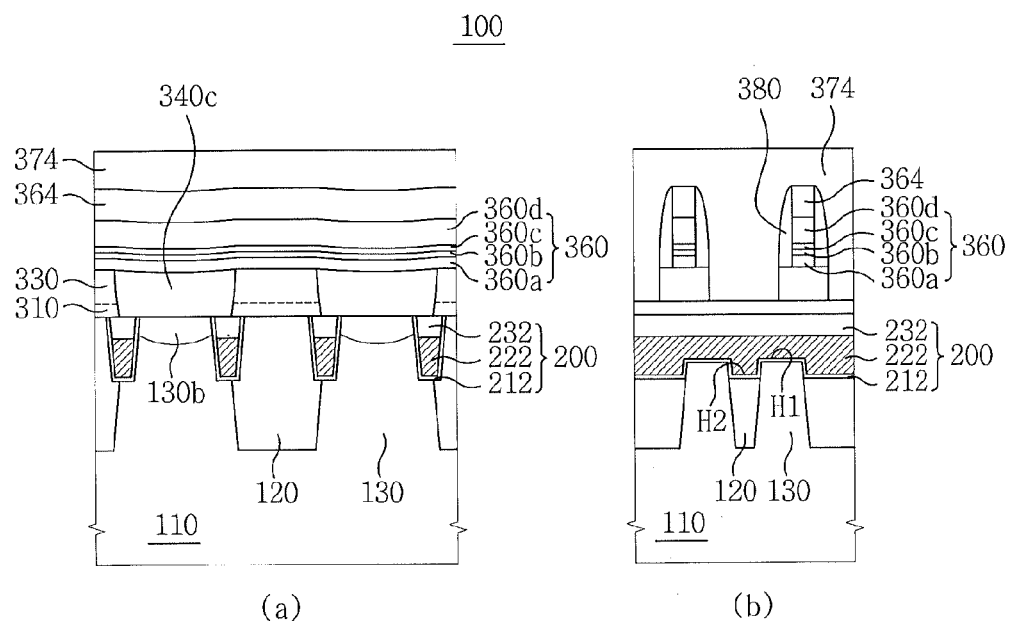
(a)        (b)
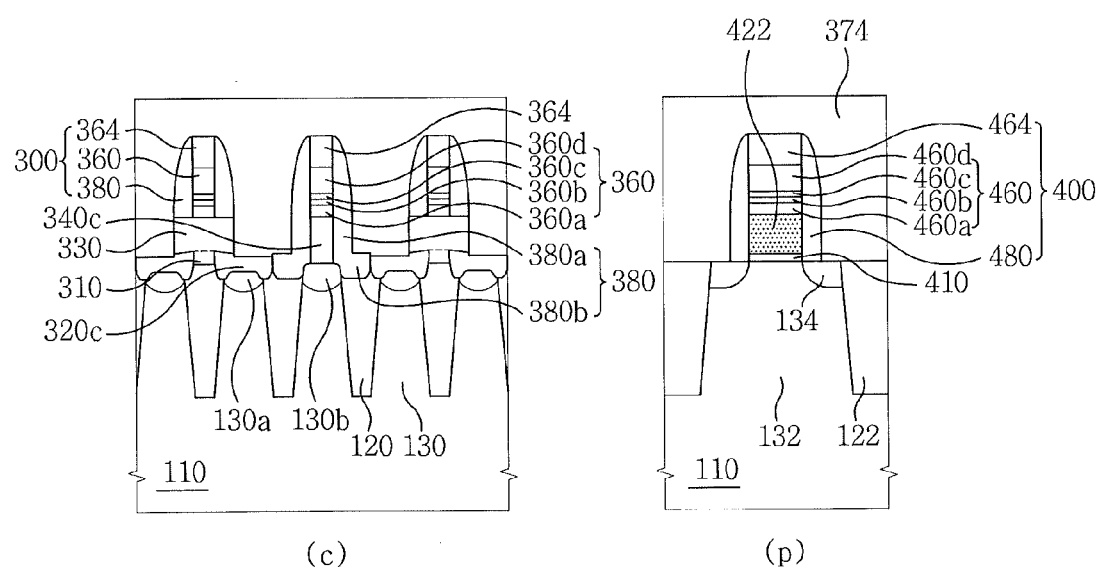
(c)        (p)

FIG. 4P
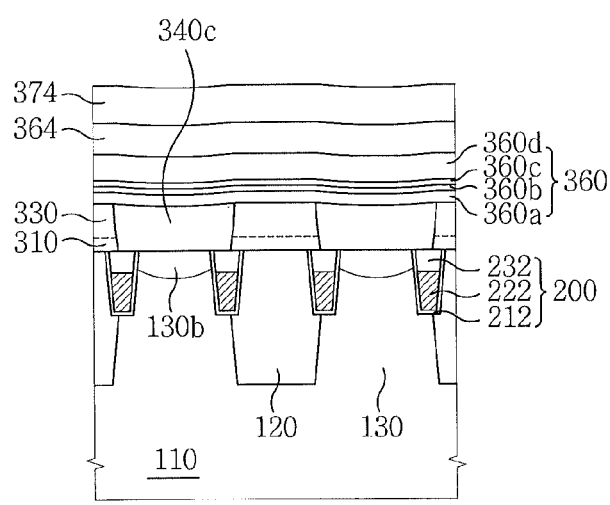
(a)
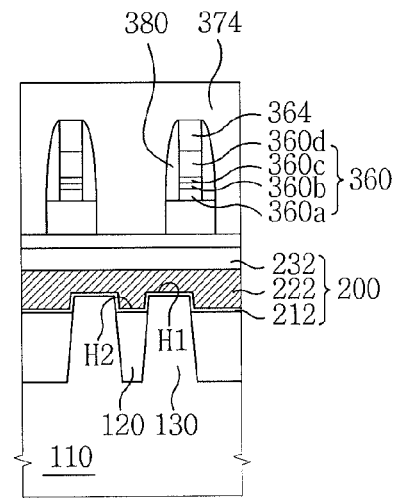
(b)
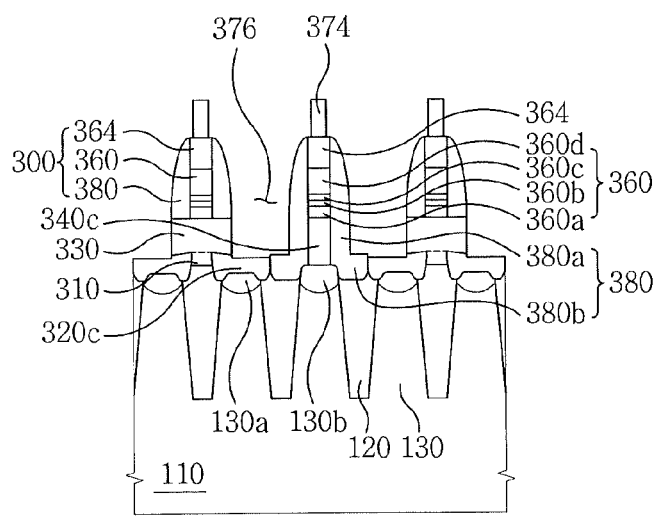
(c)
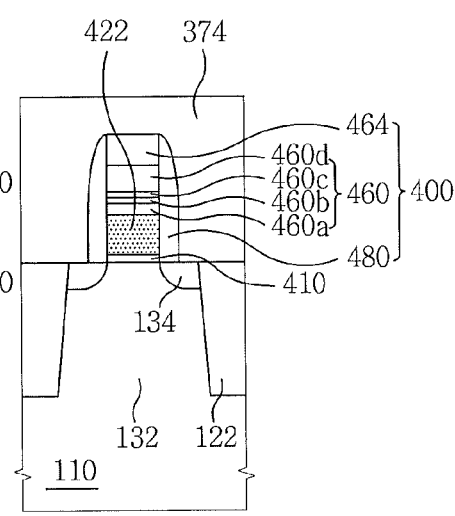
(p)

FIG. 4Q
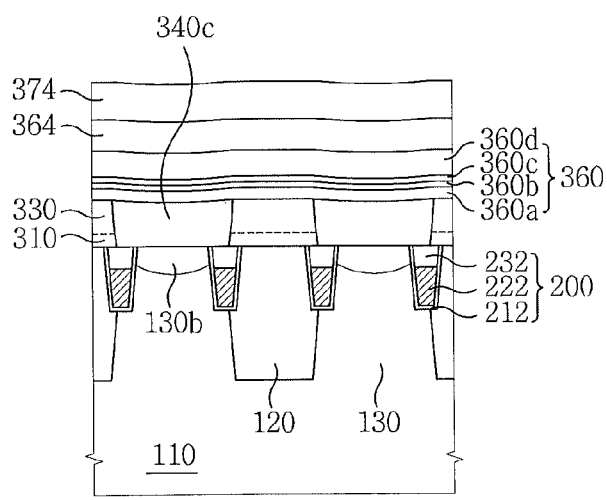
(a)
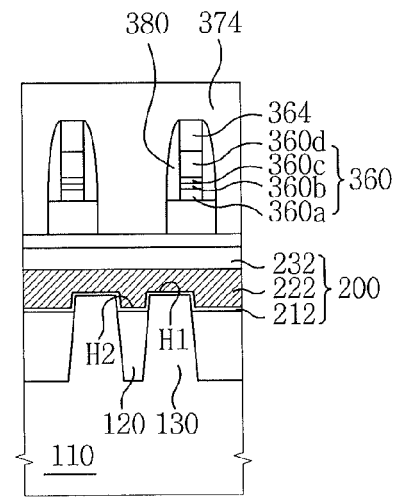
(b)
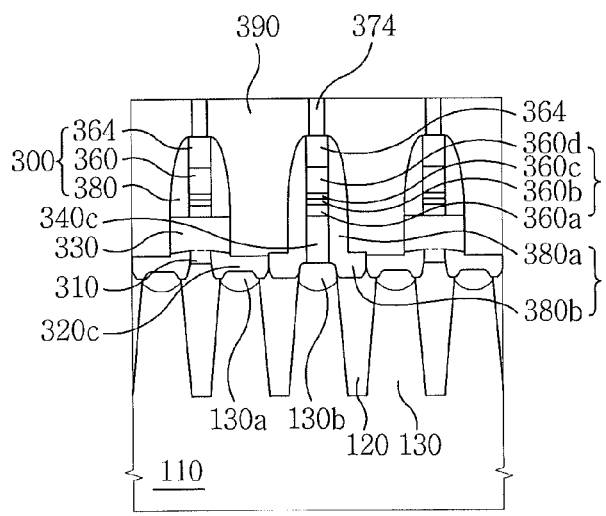
(c)
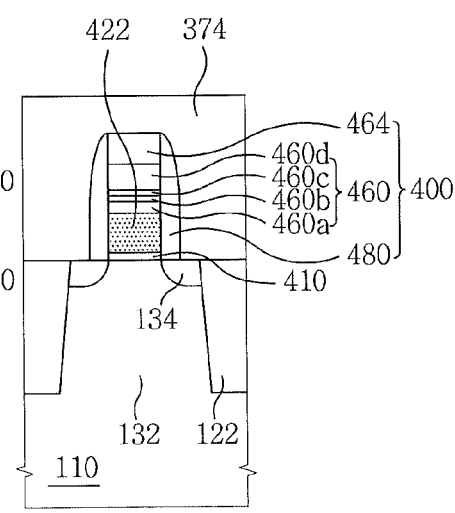
(p)

FIG. 5A
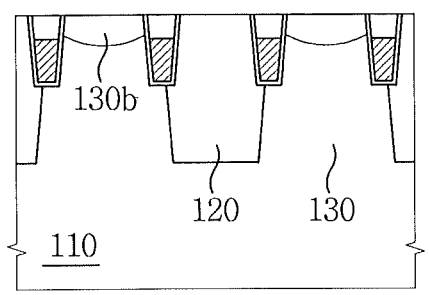
(a)
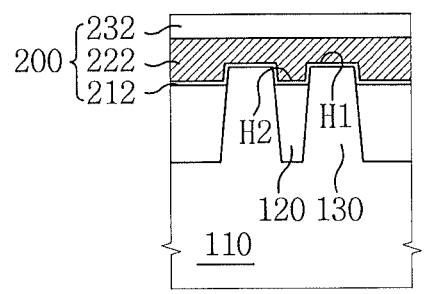
(b)
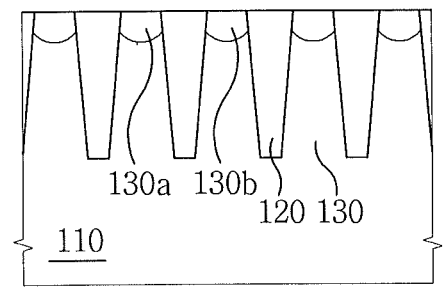
(c)
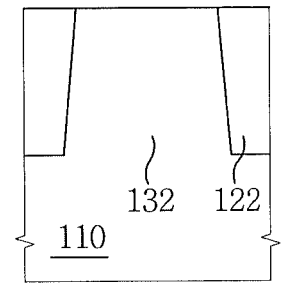
(p)

FIG. 5B
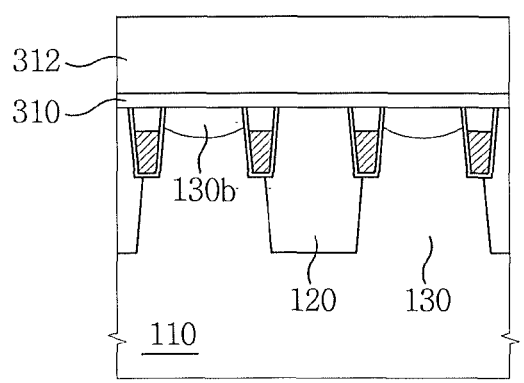
(a)
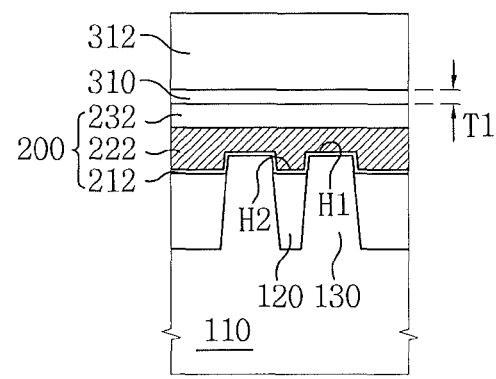
(b)
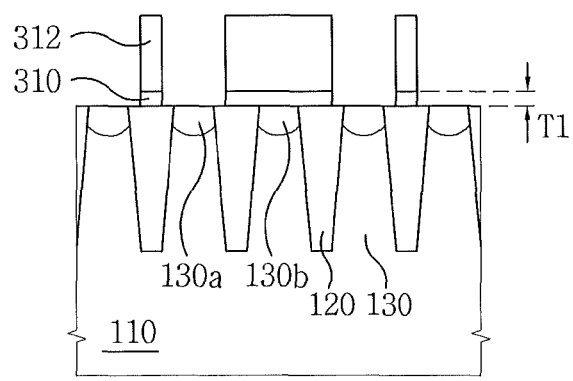
(c)
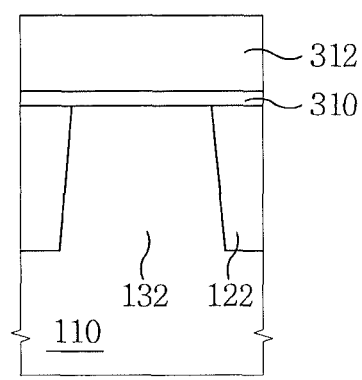
(p)

FIG. 5C
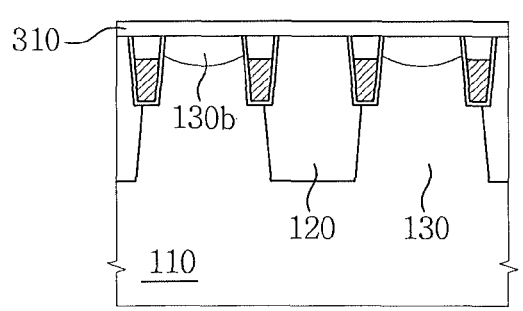
(a)
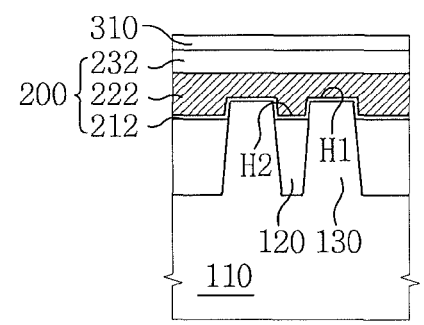
(b)
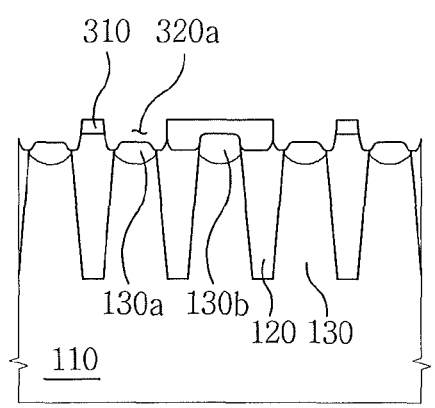
(c)
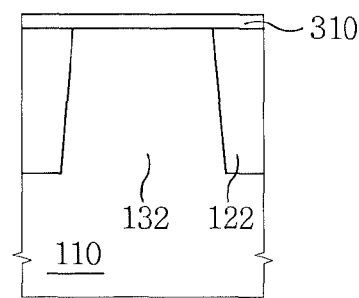
(p)

FIG. 5D
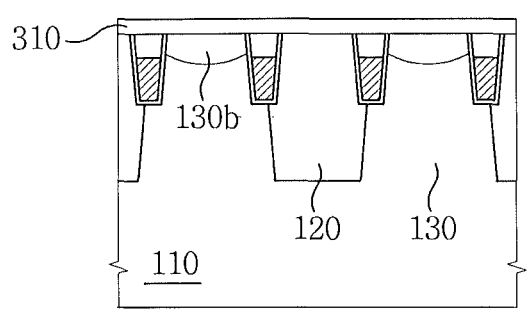
(a)
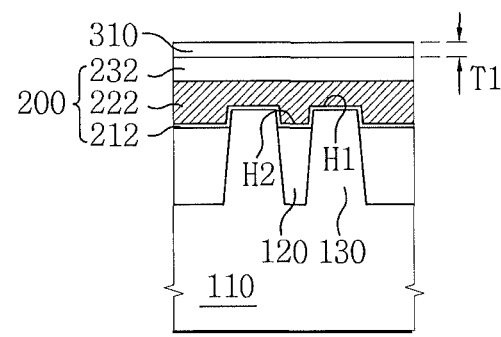
(b)
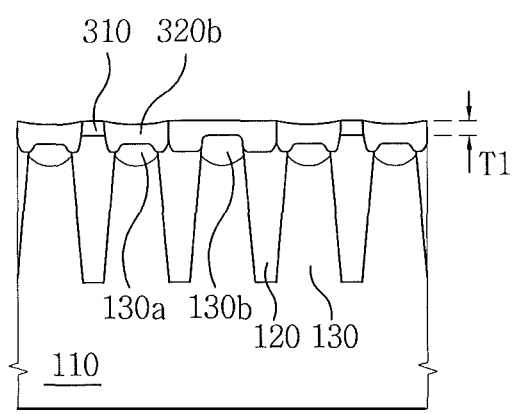
(c)
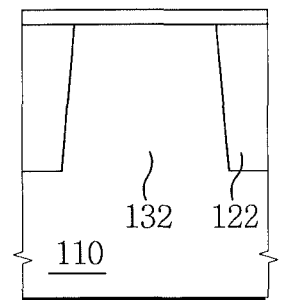
(p)

FIG. 5E
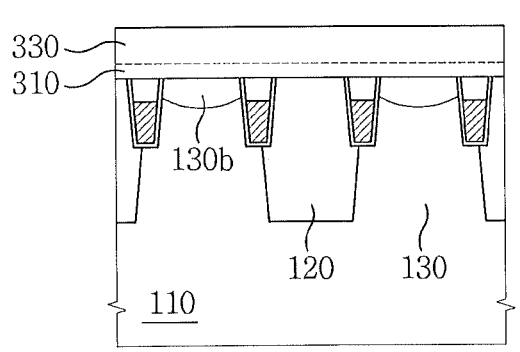
(a)
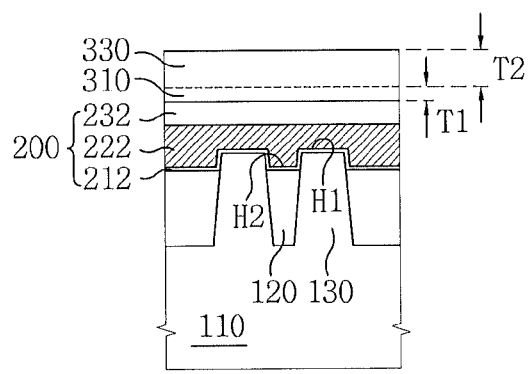
(b)
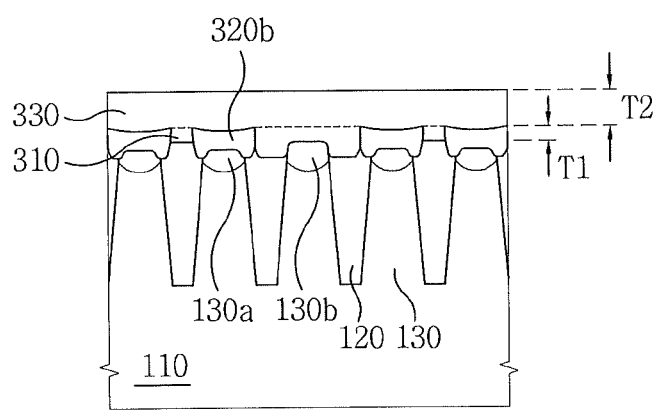
(c)
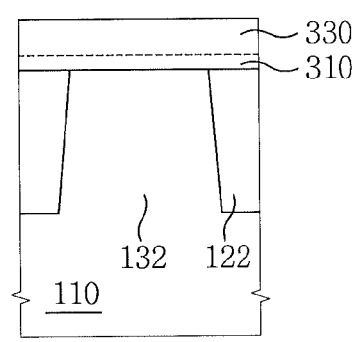
(p)

FIG. 5F
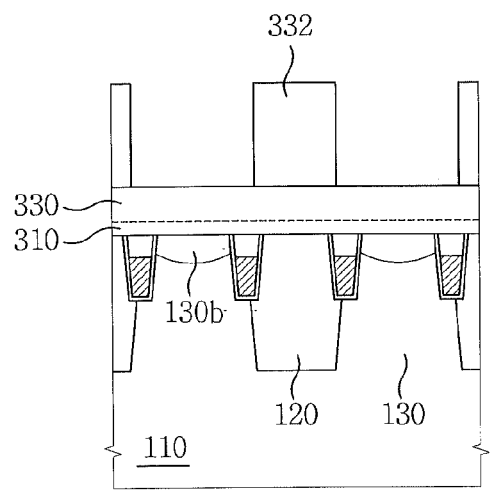
(a)
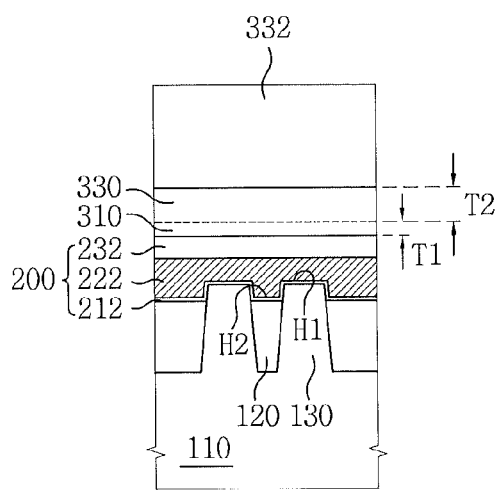
(b)
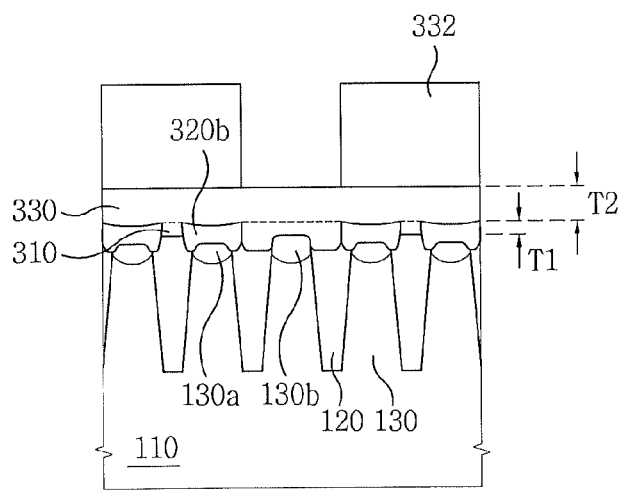
(c)
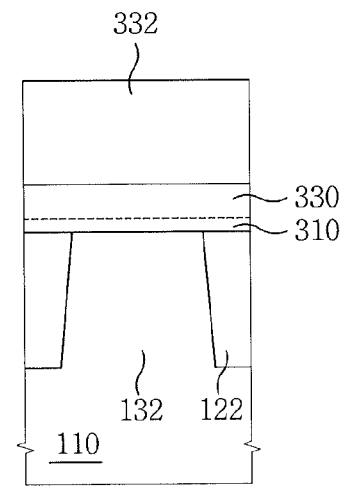
(p)

FIG. 5G
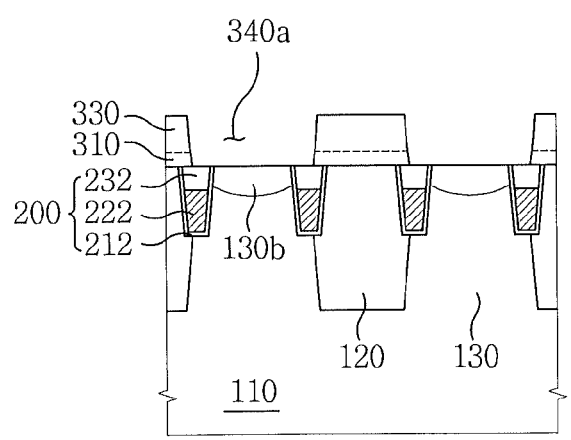
(a)
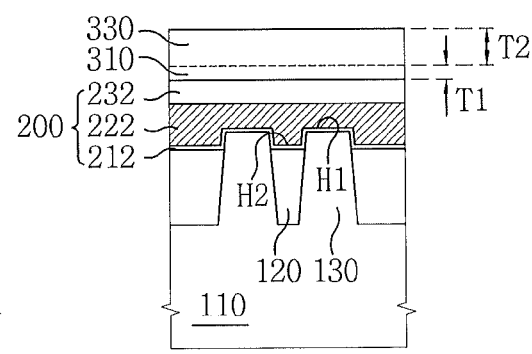
(b)
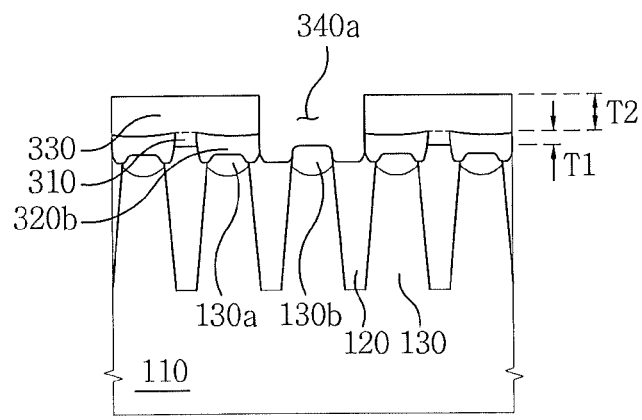
(c)
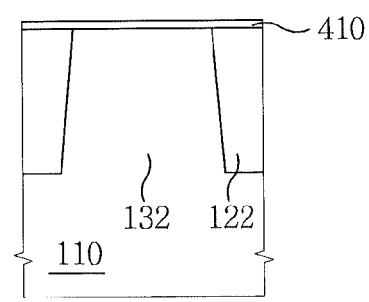
(p)

FIG. 5H
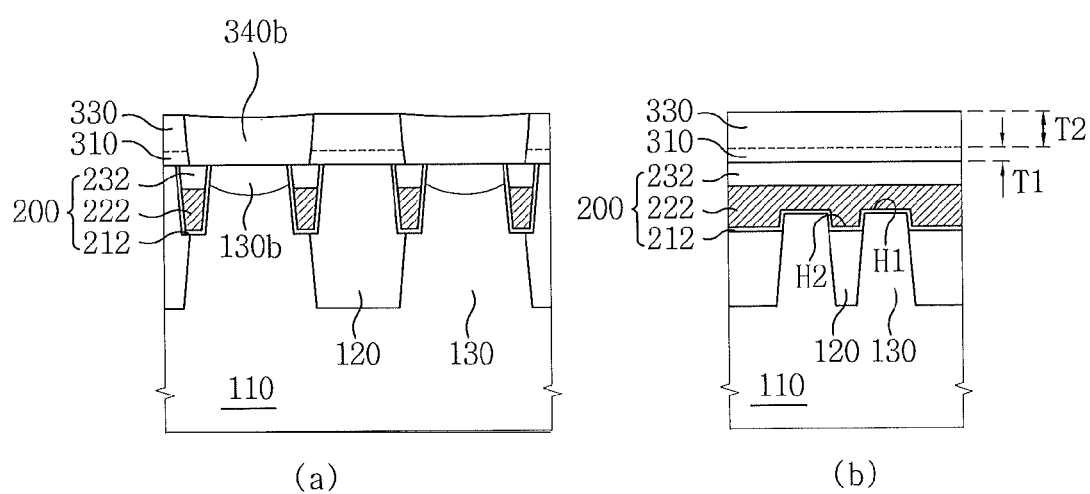
(a)  (b)
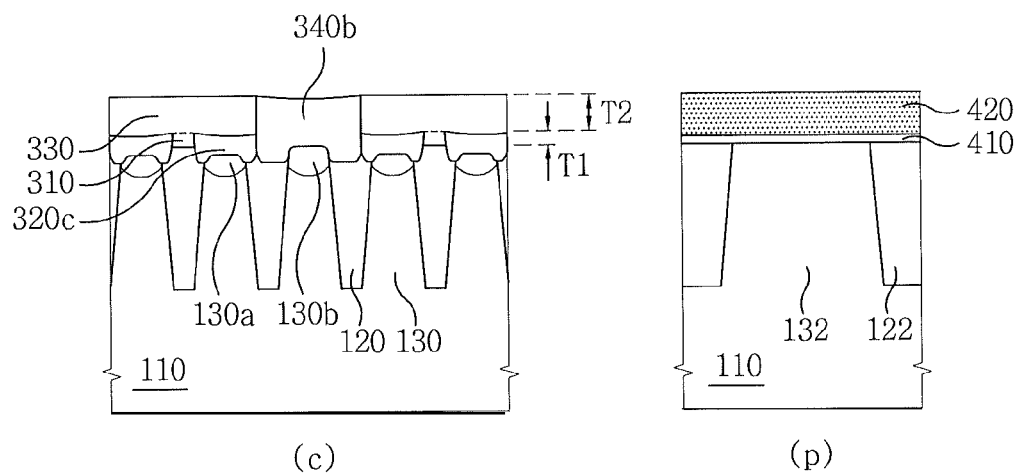
(c)  (p)

SEMICONDUCTOR DEVICES INCLUDING BURIED-CHANNEL-ARRAY TRANSISTORS

CROSS-REFERENCE TO RELATED APPLICATION

This application claims priority under 35 U.S.C. §119 to Korean Patent Application No. 10-2010-0101494 filed on Oct. 18, 2010, the disclosure of which is hereby incorporated by reference in its entirety.

BACKGROUND

With an increase in the integration density of semiconductor devices, the structures and thus the fabrication processes of semiconductor devices are becoming increasingly complex. Thus, buried-channel-array-transistor (BCAT) technique and a 6F2 layout technique have been proposed.

SUMMARY

Embodiments of the inventive concept provide semiconductor devices including buried-channel-array transistors. Other embodiments of the inventive concept provide semiconductor modules including a semiconductor device having buried-channel-array transistors.

Other embodiments of the inventive concept provide an electronic system including a semiconductor device or semiconductor module including buried-channel-array transistors.

Other embodiments of the inventive concept provide various methods of fabricating semiconductor devices including buried-channel-array transistors. The technical objectives of the inventive disclosure are not limited to the above disclosure; other objectives may become apparent to those of ordinary skill in the art based on the following descriptions.

In accordance with an aspect of the inventive concept, a semiconductor device includes: a substrate including isolation regions and active regions defined by the isolation regions; gates disposed in the substrate and configured to intersect the active regions and define source regions and drain regions in the active regions; an interlayer insulating layer disposed on the substrate; bit line contact plugs configured to penetrate the interlayer insulating layer and contact the drain regions; and first bit line structures and second bit line structures disposed on the interlayer insulating layer, The first bit line structures include first bit line conductive patterns and first bit line spacers covering sidewalls of the first bit line conductive patterns. The second bit line structures include second bit line conductive patterns configured to contact the bit line contact plugs to be substantially parallel to the first bit line conductive patterns and first bit line spacers covering sidewalls of the second bit line conductive patterns and sidewalls of the bit line contact plugs.

In accordance with another aspect of the inventive concept, a semiconductor device includes: a substrate including a first active region and a second active region defined by an isolation region; a first interlayer insulating layer disposed on the substrate; storage contact pads disposed through the first interlayer insulating layer and electrically connected to the first active region; a second interlayer insulating layer disposed on the first interlayer insulating layer and the storage contact pad; bit line contact plugs disposed through the first interlayer insulating layer and the second interlayer insulating layer and electrically connected to the second active region; first bit line electrodes disposed on the second interlayer insulating layer and second bit line electrodes disposed on the bit line contact plugs parallel to the first bit line electrodes; first bit line spacers disposed on sidewalls of the first bit line electrodes and second bit line spacers disposed on sidewalls of the second bit line electrodes; storage contact plugs interposed between the first and second bit line spacers and electrically connected to the storage contact pads; and storage electrodes electrically connected to the storage contact plugs.

In accordance with still another aspect of the inventive concept, a semiconductor device includes: a substrate including a cell area and a peripheral area and having an active region defined by an isolation region; a word line disposed under the surface of the substrate in the cell area and configured to intersect the active region; a bit line contact plug disposed on the surface of the substrate in the cell area and connected to the active region; an interlayer insulating layer disposed at the same level as the bit line contact plug in the cell area; a first bit line structure including a first bit line conductive pattern disposed on the interlayer insulating layer in the cell area and first bit line spacers disposed on both sidewalls of the first bit line conductive pattern; a second bit line structure including a second bit line conductive pattern disposed on the bit line contact plug in the cell area and second bit line spacers disposed on both sidewalls of the second bit line conductive pattern and both sidewalls of the bit line contact plug; and a peripheral gate disposed on the surface of the substrate in the peripheral area and including a first peripheral gate conductive pattern and a second peripheral gate conductive pattern disposed on the first peripheral gate conductive pattern, the second peripheral gate conductive pattern disposed at substantially the same level as the first and second bit line conductive pattern.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

The foregoing and other features and advantages of the inventive concepts will be apparent from the more particular description of described embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 2(a), 2(b), and 2(c) are longitudinal sectional views taken along lines A-A', B-B', and C-C' of FIG. 1A;

FIG. 2(p) is a longitudinal sectional view taken along line P-P' of FIG. 1B;

FIGS. 5A through 5H are longitudinal sectional views illustrating methods of fabricating a semiconductor device according to some other embodiments of the inventive concept.

DETAILED DESCRIPTION OF THE EMBODIMENTS

Figure 1A:
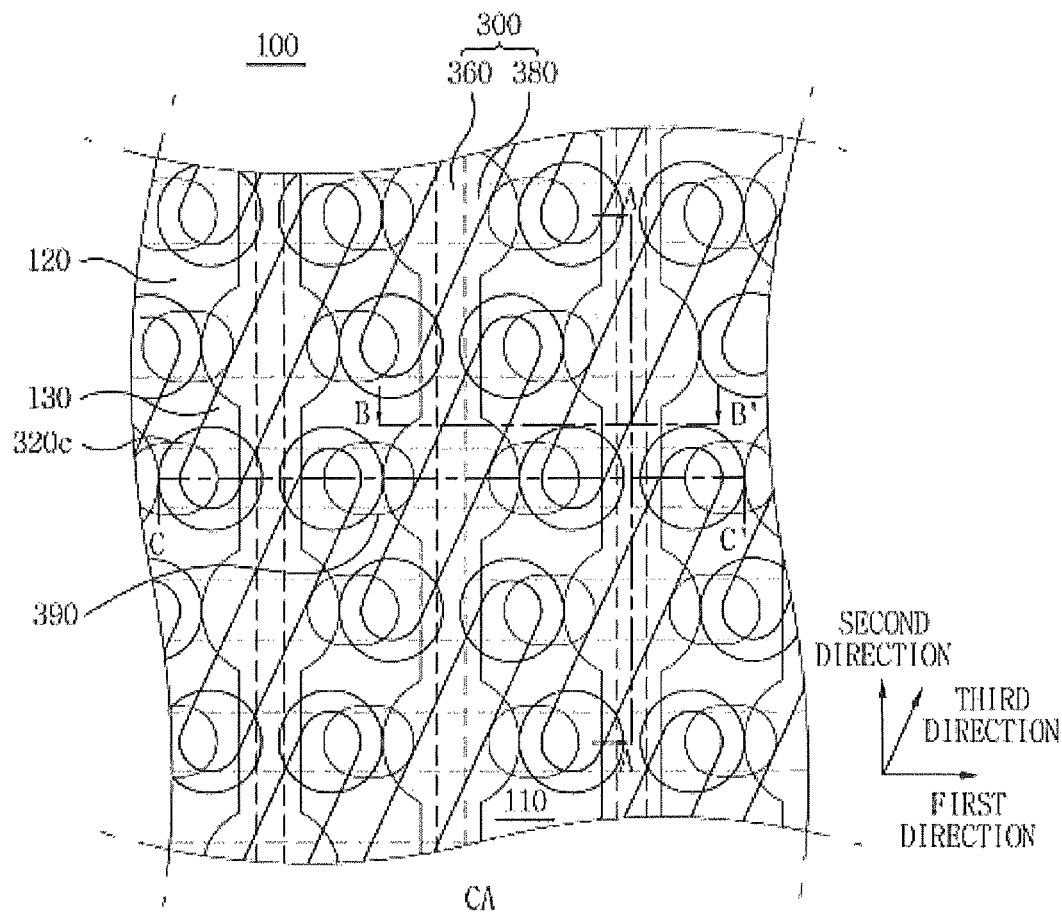
FIGS. 1A and 1B are layouts illustrating configuration of a semiconductor device according to some embodiments of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity. Like numbers refer to like elements throughout.

Figure 1B:
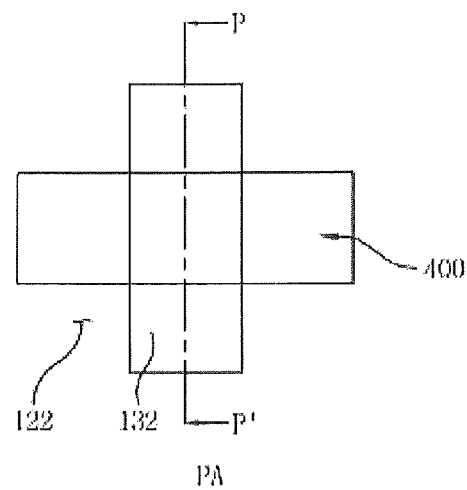

FIGS. 1A and 1B are layouts illustrating configuration of a semiconductor device according to embodiments of the inventive concept, (a), (b), and (c) of FIG. 2 are longitudinal sectional views taken along lines A-A', B-B', and C-C' of FIG. 1A, and (p) of FIG. 2 is a longitudinal sectional view taken along line P-P' of FIG. 1B. Referring to FIGS. 1A, 1B, and 2, a semiconductor device 100 according to some embodiments of the inventive concept may include a cell area CA and a peripheral area PA of a substrate 110.

The cell area CA may include a plurality of cells, and each of the cells may include a single cell gate 200 and a single storage electrode 500. For example, a plurality of cell transistors and a plurality of cell capacitors may be regularly formed in the cell area CA. Accordingly, the cell area CA may include cell isolation regions 120, cell active regions 130, and cell gates 200, which may be disposed under the surface of the substrate 110, and bit lines 300 and storage electrodes 500, which may be disposed on the surface of the substrate 110. The cell gates 200 may be interpreted as word lines W.

The peripheral area PA may include a peripheral gate 400 configured to perform read and write operations to store data in the cells. For example, a complementary-metal-oxide-semiconductor (CMOS) transistor constituting a logic circuit may be formed in the peripheral area PA. Accordingly, the peripheral area PA may include a peripheral isolation region 122 and a peripheral active region 132, which may be disposed under the surface of the substrate 110, and the peripheral gate 400 disposed on the surface of the substrate 110.

The cell gate 200 of the cell area CA may include a recess-type channel disposed in a vertical direction to the substrate 110. For instance, the cell gate 200 may include a recess-type channel obtained by increasing the length of a gate channel so as to inhibit a short channel effect (SCE). Also, the cell gate 200 may be provided as a buried type in the substrate 110. In contrast, the peripheral gate 400 of the peripheral area PA may include a planar-type channel.

The cell gate 200 of the cell area CA may include a cell gate insulating layer 212, a cell gate conductive pattern 222, and a cell gate capping pattern 232 stacked within a trench for forming a buried gate in the cell active region 120. In this case, a top surface of the cell active region 130 disposed under the cell gate conductive pattern 222 may be formed to a level H1 higher than a level H2 of a top surface of the cell isolation region 120 disposed under the cell gate conductive pattern 232 so that the cell gate 200 can be formed as a transistor having the recess-type channel and a fin field-effect-transistor (Fin FET) structure with the protruding cell active region 130.

In the cell area CA, the cell active regions 130 defined by the cell isolation regions 120 may be repetitively arranged at predetermined intervals. Each of the cell active regions 130 may include a cell source region 130a and a cell drain region 130b as a portion of the substrate 110. The cell active regions 130 may be tilted in a diagonal direction with respect to a first direction and a second direction of the substrate 110. The cell gates 200 may extend in the first direction, while the bit lines 300 may extend in the second direction. The first direction may be substantially orthogonal to the second direction. Two rows of gates 200 may intersect one bit line 300 in each of the cell active regions 130. The cell active region 130 may be tilted at a predetermined angle to the cell gate 200 and the bit line 300.

For example, when one cell active region 130 has two unit cell structures, although one unit cell may have a second-directional length of 4F and a first-directional length of 2F based on a minimum linewidth, a left upper region and a right lower region of the corresponding unit cell may correspond to regions of adjacent cells so that the corresponding unit cell can have an area of 6F2. Thus, according to a 6F2 cell structure, the cell gate 200 and the bit line 300 may intersect each other at right angles, and the cell active region 130 may be defined in a bar shape by the cell isolation region 120 and tilted in a diagonal direction (e.g., third direction) with respect to the cell gate 200 and the bit line 300.

The bit line 300 may include a bit line conductive pattern 360, a bit line hard mask pattern 364, and a bit line spacer 380.

The bit line conductive pattern 360 may include doped silicon, a metal, and/or a metal silicide, which may have high electrical conductivity. The semiconductor device 100 according to the present embodiments may include a bit line contact plug 340c disposed in a region where the bit line conductive pattern 360 is electrically or physically connected to the cell drain region 130b. The bit line conductive pattern 360 may serve as a bit line electrode with an interconnection function. The bit line hard mask pattern 364 may serve as a bit line capping layer configured to protect the bit line conductive pattern 360. The bit line contact plug 340c may include doped silicon. Alternatively, the bit line contact plug 340c may include a metal and/or a metal compound. The bit line hard mask pattern 364 may include silicon nitride having an insulation characteristic. The bit line spacer 380 may include silicon nitride.

The bit line conductive pattern 360 may include a bit line electrode pattern 360d. When the bit line electrode pattern 360d is formed of a metal compound and the bit line contact plug 340c is formed of doped silicon, the bit line conductive pattern 360 may further include a bit line lower metal silicide pattern 360a, a bit line barrier pattern 360b, and a bit line upper metal silicide pattern 360c, which may be disposed on the bit line contact plug 340c. The bit line lower metal silicide pattern 360a may include a metal layer and/or a metal silicide material. For example, the bit line lower metal silicide pattern 360a may include a material containing both a metal silicide and a metal. The bit line barrier pattern 360b may include titanium nitride (TiN). The bit line upper metal silicide pattern 360c may include a metal silicide and/or a metal nitride. In this case, the bit line electrode pattern 360d may include the same metal as the bit line upper metal silicide pattern 360c.

Meanwhile, the bit lines 300 may have at least two different widths according to a position. For instance, the width of the bit line conductive pattern 360 of the bit line 300 may be increased in a region of a bit line contact DC Rdc including the bit line contact plug 340c. Accordingly, the bit line 300 configured to directly form a contact with the cell drain region 130c may have a tab structure with a greater width than the bit line 300 configured not to form a contact with the cell drain region 130b. As described above, the bit line contact plug 340c may be further formed in the bit line 300 having the tab structure.

In addition, the bit line contact plug 340c may be surrounded with a first interlayer insulating layer 310 or a second interlayer insulating layer 330 in the second direction and surrounded with the bit line spacer 380 in the first direction. A width W1 between the bit line spacers 380 may be smaller than a width W2 between the first and second interlayer insulating layers 310 and 330. That is, the bit line contact plug 340c may have a second-directional width W2 greater than a first-directional width W1. Accordingly, a contact area between the bit line contact plug 340c and the active region 130 may be increased in the first direction.

The semiconductor device 100 according to some embodiments may include the first interlayer insulating layer 310 disposed on the substrate 110, a storage contact pad 320c disposed through the first interlayer insulating layer 310 and electrically connected to the cell source region 130a, the second interlayer insulating layer 330 disposed on the first interlayer insulating layer 310 and the storage contact pad 320c, and a storage contact plug 390 disposed through the second interlayer insulating layer 330 and electrically connected to the storage contact pad 320c. A thickness T1 of the first interlayer insulating layer 310 may be substantially equal to the thickness of the storage contact pad 320c. The sum of thicknesses T1 and T2 of the first and second interlayer insulating layers 310 and 330 may be substantially equal to the thickness of the bit line contact plug 340c. The thickness T1 of the first interlayer insulating layer 310 may be equal to or less than the thickness T2 of the second interlayer insulating layer 330.

Accordingly, a top surface level L1 of the storage contact pad 320c may be half of a top surface level L2 of the bit line contact plug 340c or less. The storage contact pad 320c may increase a contact area between the storage contact plug 390 and the cell source region 130a and reduce a contact resistance therebetween. Accordingly, the storage contact pad 320c may wholly cover at least the cell source region 130a and partially cover adjacent cell isolation regions 120. Here, a distance between adjacent storage contact pads 320c may be 60 Å or more. The storage contact pad 320c and the storage contact plug 390 may include doped silicon. Adjacent storage contact plugs 390 may be electrically insulated from each other by a third interlayer insulating layer 374. That is, the storage contact plug 390 may be formed through the third interlayer insulating layer 374 between the bit lines 300.

In the bit line 300, the region of the bit line contact DC Rdc under which the bit line contact plug 340c is provided may have a different structure from a non-contact region under which the bit line contact plug 340c is not provided. The bit line 300 may include a first bit line structure BL1 that is electrically insulated from the substrate 110 by the first and second interlayer insulating layers 310 and 330 and a second bit line structure BL2 that is connected to the substrate 110 through the bit line contact plug 340c. Although the bit line 300 may be classified as the first and second bit line structures BL1 and BL2 as can be seen from (c) of FIG. 2, some embodiments provide that the bit line 300 may not be divided into the first and second bit line structures BL1 and BL2 but may be integrally connected as can be seen from (b) of FIG. 2. The first bit line structure BL1 may include a first bit line conductive pattern 360x disposed on the first and second interlayer insulating layers 310 and 330, a first bit line hard mask pattern 364x disposed on the first bit line conductive pattern 360x, and first bit line spacers 380x disposed on both sidewalls of the first bit line conductive pattern 360x. The second bit line structure BL2 may include a second bit line conductive pattern 360y disposed on the bit line contact plug 340c to be substantially parallel to the first bit line conductive pattern 360x, a second bit line hard mask pattern 364y disposed on the second bit line conductive pattern 360y, and second bit line spacers 380y disposed on both sidewalls of the second bit line conductive pattern 360y.

The second bit line spacers 380y disposed in the region of the bit line contact DC Rdc may be at a different level from the first bit line spacers 380x disposed in the remaining region. For example, the first and second bit line spacers 380x and 380y may have the same top surface level and different bottom surface levels. The second bit line spacers 380y disposed in the region of the bit line contact DC Rdc may be at a lower bottom surface level than the first bit line spacers 380x disposed in the remaining region. As described above, the bit line contact plug 340c may be further interposed between the second bit line conductive pattern 360y and the substrate 110 in the region of the bit line contact DC Rdc. In the region of the bit line contact DC Rdc, the second bit line spacers 380y may further include first extensions 380a configured to extend in a vertical direction of the substrate 110 and a second extension 380b configured to extend in a horizontal direction of the substrate 110. The first extensions 380a may extend from lower portions of the both sidewalls of the second bit line conductive pattern 360y through both sidewalls of the bit line contact plugs 340c to the cell drain region 130b. The second extensions 380b may extend from lower edges of the bit line contact plugs 340c to adjacent storage contact plugs 390 or adjacent storage contact pads 320c. The second extensions 380b of the second bit line spacers 380y may contact the storage contact pads 320c. In this case, the second extensions 380b may expand horizontally from both sidewalls of the bit line conductive patterns 360 and take on a semicircular shape or a semielliptical shape. Also, the second extensions 380b may be at substantially the same top surface level as the storage contact pads 320c.

Accordingly, the second bit line spacers 380y may cover the both sidewalls of the bit line contact plugs 340c in the region of the bit line contact DC Rdc, thereby improving a short margin between the bit line contact plug 340c and the storage contact plug 390. Also, the second bit line spacers 380y may extend in a radial direction from the lower edges of the bit line contact plugs 340c and function as an insulator configured to prevent a short failure between the bit line contact plug 340c and the storage contact pad 320c. However, the first and second interlayer insulating layers 310 and 330 may be further interposed between the second bit line conductive patterns 360y and the substrate 110 in the region other than the region of the bit line contact DC Rdc so that the bottom surface level of the first bit line spacers 380y can extend to a top surface level of the second interlayer insulating layer 330. That is, the bottom surface level of the first bit line spacers is the same as the top surface level of the interlayer insulating layer, and the bottom surface level of the second bit line spacers is lower than the top surface of the interlayer insulating layer.

The peripheral gate 400 may include a peripheral gate insulating layer 410, a first peripheral gate conductive pattern 422, a second peripheral gate conductive pattern 460, a peripheral gate hard mask pattern 464, and peripheral gate spacers 480. The peripheral gate insulating layer 410 may include silicon oxide. The peripheral gate insulating layer 410 may include the same material as the first and second interlayer insulating layers 310 and 330. However, the peripheral gate insulating layer 410 may have a smaller thickness than the first and second interlayer insulating layers 310 and 330. Also, the second peripheral gate conductive pattern 460 and the peripheral gate hard mask pattern 464 may be formed using the same material and/or to the same thickness at the same level as or a similar level to the bit line conductive pattern 360 and the bit line hard mask pattern 364, respectively.

When the bit line conductive pattern 360 further includes a bit line lower metal silicide pattern 360a, a bit line barrier pattern 360b, and a bit line upper metal silicide pattern 360c in addition to the bit line electrode pattern 360d, the second peripheral gate conductive pattern 460 may further include a peripheral gate lower metal silicide pattern 460a, a peripheral gate barrier pattern 460b, and a bit line upper metal silicide pattern 460c in addition to the peripheral gate electrode pattern 460d. In this case, the peripheral gate lower metal silicide pattern 460a, the peripheral gate barrier pattern 460b, the peripheral gate upper metal silicide pattern 460c, and the peripheral gate electrode pattern 460d may be formed using the same material and to the same thickness at substantially the same level as and/or a similar level to the bit line lower metal silicide pattern 360a, the bit line barrier pattern 360b, the bit line upper metal silicide pattern 360c, and the bit line electrode pattern 360d, respectively.

In some embodiments, the peripheral gate 400 may include a CMOS transistor. Accordingly, the peripheral active region 132 may include various types of impurity regions 134 as a portion of the substrate 110. When the peripheral gate 400 is a PMOS transistor, the impurity regions 134 may be of a p type. When the peripheral gate 400 is an NMOS transistor, the impurity regions 134 may be of an n type.

Hereinafter, a method of fabricating a semiconductor device having the above-described configuration according to embodiments of the inventive concept will be described in detail.

FIGS. 3A through 3Q are longitudinal sectional views illustrating a method of fabricating a semiconductor device according to some embodiments of the inventive concept. Each of FIGS. 3A through 3Q shows longitudinal sectional views taken along lines A-A', B-B', and C-C' of FIG. 1A.

Referring to FIGS. 1A and 3A, a buried-transistor forming process may be performed within a substrate 110 of a cell area CA. Before the buried-transistor forming process, an isolation process may be performed on the entire substrate 110 including the cell area CA. A trench may be formed within the substrate 110 using a shallow-trench-isolation (STI) forming process and filled with an insulating material, thereby forming a cell isolation region 120 defining a cell active region 130 in the cell area CA. The substrate 110 may be formed of single crystalline silicon or silicon germanium. The insulating material may include a torene silazene (TOSZ) layer, boro-phosphosilicate glass (BPSG), undoped silicate glass (USG), and/or a high density plasma (HDP) oxide, which may function as an insulator. The cell active region 130 may have an isolated island shape provided as a bar-type with a length that is greater than a width thereof.

Thereafter, a buried-gate forming process may be performed on the substrate 110 of the cell area CA. Initially, a trench (not shown) for forming a buried gate may be formed in the cell area CA using a recess process. Due to the recess process, the cell active region 130 and the cell isolation region 120 may be partially removed. In this case, more of the cell active region 130 may be removed than the cell isolation region 120. The cell isolation region 120 may be formed to a top surface level H2 that is lower than a top surface level H1 of the cell active region 130 so that the cell active region 130 can have a protruding fin structure.

A cell gate insulating layer 212 may be formed in the trench for forming the buried gate using a chemical vapor deposition (CVD) process and/or a thermal oxidation process. A gate conductive layer (not shown) filling the trench for forming the buried gate may be formed on the cell gate insulating layer 212 using a physical vapor deposition (PVD) process and/or a sputtering process. A portion of the gate conductive layer may be removed using a chemical mechanical polishing (CMP) process and/or an etchback process, thereby forming a cell gate conductive pattern 222. A top surface level of the cell gate conductive pattern 222 may be lower than a top surface level of the substrate 110. A cell gate capping layer (not shown) may be coated on the exposed cell gate conductive pattern 222 to protect the cell gate conductive pattern 222. Furthermore, a portion of the cell gate capping layer may be removed using a CMP process and/or an etchback process until a top surface of the substrate 110 is exposed, thereby forming a cell gate capping pattern 232. The cell gate insulating layer 212 may be formed using a silicon oxide layer. The cell gate conductive pattern 222 may be formed using a doped polysilicon (poly-Si) layer, a metal layer, and/or a metal compound layer. The cell gate capping pattern 232 may include silicon oxide. The cell gate 200 including the cell gate insulating layer 212, the cell gate conductive pattern 222, and the cell gate capping pattern 232 may be used as a word line WL.

By forming a cell source region 130a and a cell drain region 130b using an ion implantation process, a buried transistor including the cell gate insulating layer 212, the cell gate conductive pattern 222, the cell gate capping pattern 232, and the cell source/drain regions 130a and 130b may be completed. In this case, the ion implantation process may be performed on the cell area CA using the cell gate 200 and the isolation region 220 as ion implantation masks. In some embodiments, the ion implantation process may be performed before forming the cell gate 200.

Referring to FIG. 3B, a first interlayer insulating layer 310 may be formed on the top surface of the substrate 110 in the cell area CA. For instance, an insulating material may be deposited on the entire surface of the substrate 110 so that the first interlayer insulating layer 310 can be formed to a first thickness T1. The first thickness T1 may range from 200 to 400 Å. The insulating material may include silicon oxide. For example, some embodiments provide that the insulating material may be tetraethoxysilane (TEOS), HDP, and/or BPSG.

Subsequently, a first photoresist pattern 312 may be formed using a first photolithography process. A first photoresist layer (not shown) may be coated on the first interlayer insulating layer 310, and a portion of the first photoresist layer may be selectively removed using the first photolithography process. The first photoresist pattern 312 may be provided to open the first interlayer insulating layer 310 corresponding to the cell source region 130a.

Referring to FIG. 3C, the portion of the first interlayer insulating layer 310 may be selectively removed to expose the cell source region 130a. The first interlayer insulating layer 310 may be etched using the first photoresist pattern 312 as an etch mask, thereby forming a first hole 320a exposing a portion of the cell source region 130a. Thereafter, the first photoresist pattern 312 may be removed.

Referring to FIG. 3D, a preliminary storage contact pad 320b may be formed to contact the cell source region 130a. For example, a conductive material may be deposited on the entire surface of the first interlayer insulating layer 310 to fill the first hole 320a, and then planarized using a CMP process until a top surface of the first interlayer insulating layer 310 is exposed. The conductive material may include a heavily doped poly-Si material and/or a metal material.

In this case, the thickness of the preliminary storage contact pad 320b may be equal or nearly equal to the first thickness T1 of the first interlayer insulating layer 310. Accordingly, the preliminary storage contact pad 320b may be formed to a thickness of about 200 to 400 Å. After the etching process, the cell active region 130 may be at a lower top surface level than the cell isolation region 120 because a contact area between the preliminary storage contact pad 320b and the substrate 110 may be reduced toward the substrate 110 due to the slope of an inner sidewall of the first hole 320a and the cell active region 130 may be more vulnerable to etching attacks than the cell isolation region 120.

Referring to FIG. 3E, a second interlayer insulating layer 330 may be formed on the first interlayer insulating layer 310. An insulating material may be deposited again on the first interlayer insulating layer 310 including the preliminary storage contact pad 320b and partially removed using a planarization process so that the second interlayer insulating layer 330 can be formed to a second thickness T2. The thickness T2 of the second interlayer insulating layer 330 may be substantially equal to or greater than the thickness T1 of the first interlayer insulating layer 310. Accordingly, the second thickness of the second interlayer insulating layer 330 may range from about 200 to 400 Å. In this case, the deposited insulating material may include the same silicon oxide as the first interlayer insulating layer 310. Accordingly, a boundary line between the first and second interlayer insulating layers 310 and 330 may disappear. In FIG. 3E, the boundary line between the first and second interlayer insulating layers 310 and 330 is illustrated with a virtual dotted line.

Referring to FIG. 3F, a second photoresist pattern 332 may be formed using a second photolithography process. For example, a second photoresist layer (not shown) may be coated on the second interlayer insulating layer 330, and a portion of the second photoresist layer may be selectively removed using the second photolithography process. The second photoresist pattern 332 may be provided to open the first and second interlayer insulating layers 310 and 330 corresponding to the cell drain region 1301).

Referring to FIG. 3G, the first and second interlayer insulating layers 310 and 330 may be etched using the second photoresist pattern 332 as an etch mask, thereby forming a second hole 340a exposing a portion of the cell drain region 130b. Thus, the second interlayer insulating layer 330 by which the cell drain region 130b is partially exposed may be formed. Here, the second hole 340a may include a bowl-shaped hole.

Referring to FIG. 3H, a preliminary bit line contact plug 340b may be formed to directly contact the cell drain region 130b. For example, a conductive material may be formed on the entire surface of the second interlayer insulating layer 330 to fill the second hole 340a, and then planarized until a top surface of the second interlayer insulating layer 330 is exposed. The conductive material may include a heavily-doped poly-Si material or a metal material.

The preliminary storage contact pad 320b and the preliminary bit line contact plug 340b may directly contact each other and be merged with each other. In this case, the thickness of the preliminary bit line contact plug 340b may be equal to the sum of the first thickness T1 of the first interlayer insulating layer 310 and the second thickness T2 of the second interlayer insulating layer 330. Accordingly, the preliminary bit line contact plug 340b may be formed to a thickness of about 400 to 800 Å. The thickness of the preliminary storage contact pad 320b may be half of the thickness of the preliminary bit line contact plug 340b or less. Since the preliminary bit line contact plug 340b has a circular or elliptical shape, a radius of which is increased in first and second directions, the preliminary bit line contact plug 340b may have a bowl shape. The preliminary bit line contact plug 340b may have a width of about 400 to 500 Å.

Referring to FIG. 3I, a lower metal silicide layer 350a, a barrier layer 350b, an upper metal silicide layer 350c, an electrode layer 350d, and a hard mask layer 358 may be formed on the entire surface of the second interlayer insulating layer 330 using a deposition process. Each of the lower metal silicide layer 350a and the upper metal silicide layer 350c may include a metal silicide material. The barrier layer 350b may include titanium nitride (TiN). The electrode layer 350d may include a metal and/or a metal nitride.

Figure 3J:
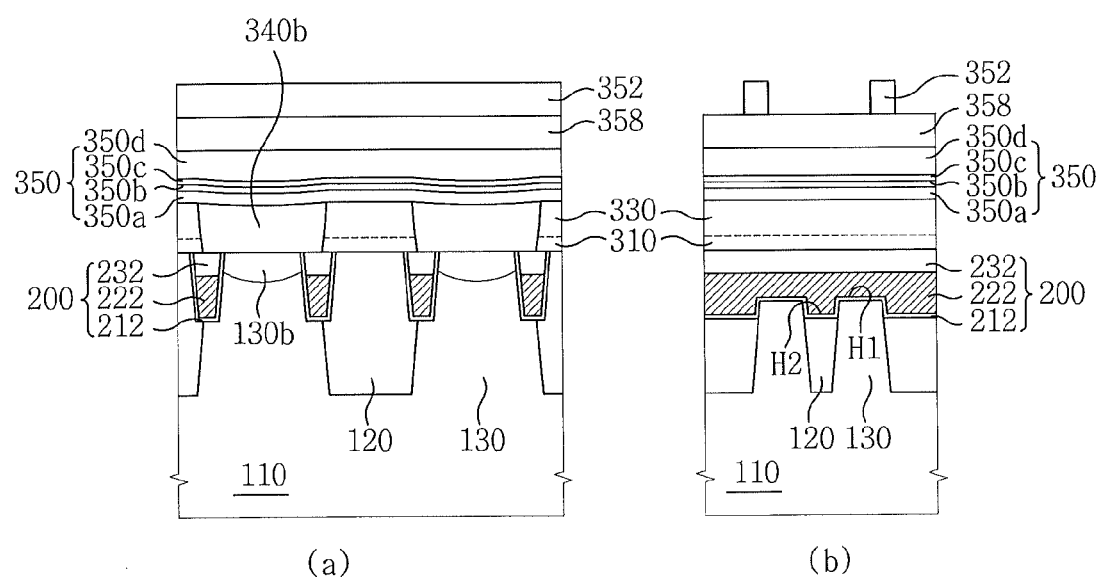
FIGS. 3A through 3Q are longitudinal sectional views illustrating methods of fabricating a semiconductor device according to some embodiments of the inventive concept.

Referring to FIG. 3J, a third photoresist pattern 352 may be formed on the hard mask layer 358 using a third photolithography process. For example, a third photoresist layer (not shown) may be coated on the hard mask layer 358, and a portion of the third photoresist layer may be selectively removed using a third photolithography process.

Referring to FIG. 3K, a bit line hard mask pattern 364 may be formed in the cell area CA. The bit line hard mask pattern 364 may be formed by removing a portion of the hard mask layer 358 using the third photoresist pattern 362 as an etch mask.

Referring to FIG. 3L, the electrode layer 350d, the upper metal silicide layer 350c, the barrier layer 350b, and the lower metal silicide layer 350a may be selectively removed using the bit line hard mask pattern 364 as an etch mask. A patterning process may be performed, thereby sequentially forming a bit line lower metal silicide pattern 360a, a bit line barrier pattern 360b, a bit line upper metal silicide pattern 360c, a bit line electrode pattern 360d, and a bit line hard mask pattern 364 in the cell area CA. In this case, a portion of the exposed preliminary bit line contact plug 340b may be removed using the second interlayer insulating layer 330 as an etch stopper. As a result, the preliminary storage contact pad 320b may be separated from the preliminary bit line contact plug 340b, the preliminary bit line contact plug 340b may become a bit line contact plug 340c, and the preliminary storage contact pad 320b may become a storage contact pad 320c. For example, a bowl-shaped preliminary bit line contact plug 340b may turn into a rectangular bit line contact plug 340c.

Referring to FIG. 3M, a spacer insulating layer 370 may be formed on the substrate 110. The spacer insulating layer 370 may include a nitride layer formed using a CVD process. For instance, the spacer insulating layer 370 may be a silicon nitride (SiN) layer or a silicon oxynitride (SiON) layer.

Referring to FIG. 3N, bit line spacers 380 may be formed on both sidewalls of the bit line hard mask pattern 364, the bit line conductive pattern 360, and the preliminary bit line contact plug 340b. The spacer insulating layer 370 may be anisotropically etched, thereby forming bit line spacers 380 in the cell area CA. In this case, in the region of the bit line contact DC Rdc, the bit line spacers 380 may extend in a vertical direction of the substrate 110 to contact the cell drain region 130b and also, extend in a horizontal direction of the substrate 110 to contact the storage contact pad 320c. In the remaining region other than the region of the bit line contact DC Rdc, the bit line spacers 380 may contact the top surface of the second interlayer insulating layer 330.

Referring to FIG. 3O, a third interlayer insulating layer 374 may be formed to cover the bit line 300. A silicon oxide layer may be deposited on the entire surface of the substrate 110 and planarized, thereby forming the third interlayer insulating layer 374 to a predetermined height.

Referring to FIG. 3P, a portion of the third interlayer insulating layer 374 may be removed, thereby forming a storage contact hole 376. In this case, the bit line spacers 380 may function as a self-alignment mask by which the storage contact hole 376 may be self-aligned.

Referring to FIG. 3Q, a conductive material may be formed to fill the storage contact hole 376, and then planarized, thereby forming a storage contact plug 390.

Referring to (c) of FIG. 2, a cylindrical storage electrode 500 may be formed on the storage contact plug 390 in the cell area CA.

FIGS. 4A through 4Q are longitudinal sectional views illustrating methods of fabricating a semiconductor device according to some embodiments of the inventive concept. Each of the FIGS. 4A through 4Q shows longitudinal sectional views taken along lines A-A', B-B', and C-C' of FIG. 1A and line P-P' of FIG. 1B.

Referring to FIGS. 1A, 1B, and 4A, a buried transistor forming process may be performed in a substrate 110 of a cell area CA. An STI forming process may be performed in the substrate 110 so that a cell isolation region 120 defining a cell active region 130 and a peripheral isolation region 122 defining a peripheral active region 132 may be formed in the cell area CA and a peripheral area PA, respectively. A recess process and a buried-gate forming process may be performed in the substrate 110 of the cell area CA, thereby forming a cell gate insulating layer 212, a cell gate conductive pattern 222, and a cell gate capping pattern 232. A cell source region 130a and a cell drain region 130b may be formed using an ion implantation process.

Meanwhile, a peripheral gate insulating layer 410 and a first peripheral gate conductive layer 420 may be formed in the peripheral area PA. The first peripheral gate conductive layer 420 may include doped silicon. The doped silicon may further include carbon (C) as compared with a preliminary storage contact pad 320b or a preliminary bit line contact plug 340b that will be formed during a subsequent process. In this case, a cell-area (CA) opening mask 430 may be formed in the peripheral area PA to cover the peripheral area PA and expose the cell area CA.

Referring to FIG. 4B, a first interlayer insulating layer 310 may be formed on a top surface of the substrate 110 in both the cell area CA and the peripheral area PA. For example, an insulating material may be deposited on the entire surface of the substrate 110, thereby forming the first interlayer insulating layer 310 to a first thickness T1. Thereafter, to open the first interlayer insulating layer 310 corresponding to the cell source region 130a, a first photoresist pattern 312 may be formed using a first photolithography process.

Referring to FIG. 4C, a portion of the first interlayer insulating layer 310 may be selectively removed, thereby forming a first hole 320a. Thus, the cell source region 130a may be exposed. Thereafter, the first photoresist pattern 312 may be removed.

Referring to FIG. 4D, the preliminary storage contact pad 320b may be formed to directly contact the cell source region 130a. For example, a conductive material, such as a heavily-doped poly-Si material, may be deposited on the entire surface of the first interlayer insulating layer 310 to fill the first hole 320a, and then planarized using a CMP process until a top surface of the first interlayer insulating layer 310 is exposed.

Referring to FIG. 4E, an insulating material, such as silicon oxide, may be deposited again on the first interlayer insulating layer 310 including the preliminary storage contact pad 320b, and then partially removed using a planarization process, thereby forming a second interlayer insulating layer 330 to a second thickness T2.

Referring to FIG. 4F, a second photoresist pattern 332 may be formed using a second photolithography process. The second photoresist pattern 332 may be provided to open the first and second interlayer insulating layers 310 and 330 corresponding to the cell drain region 130b.

Referring to FIG. 4G, the first and second interlayer insulating layers 310 and 330 may be etched using the second photoresist pattern 332 as an etch mask, thereby forming a second hole 340a exposing a portion of the cell drain region 130b. Thus, the second interlayer insulating layer 330 exposing the portion of the cell drain region 130b may be formed.

Referring to FIG. 4H, a preliminary bit line contact plug 340b may be formed to directly contact the cell drain region 130b. For example, a conductive material may be formed on the entire surface of the second interlayer insulating layer 330 to fill the second hole 340a, and then planarized until a top surface of the second interlayer insulating layer 330 is exposed. The conductive material may include a heavily-doped poly-Si material or a metal material.

In this case, the cell-area (CA) opening mask 430, the first interlayer insulating layer 310, and the second interlayer insulating layer 330 may be removed from the peripheral area PA.

Figure 4I:
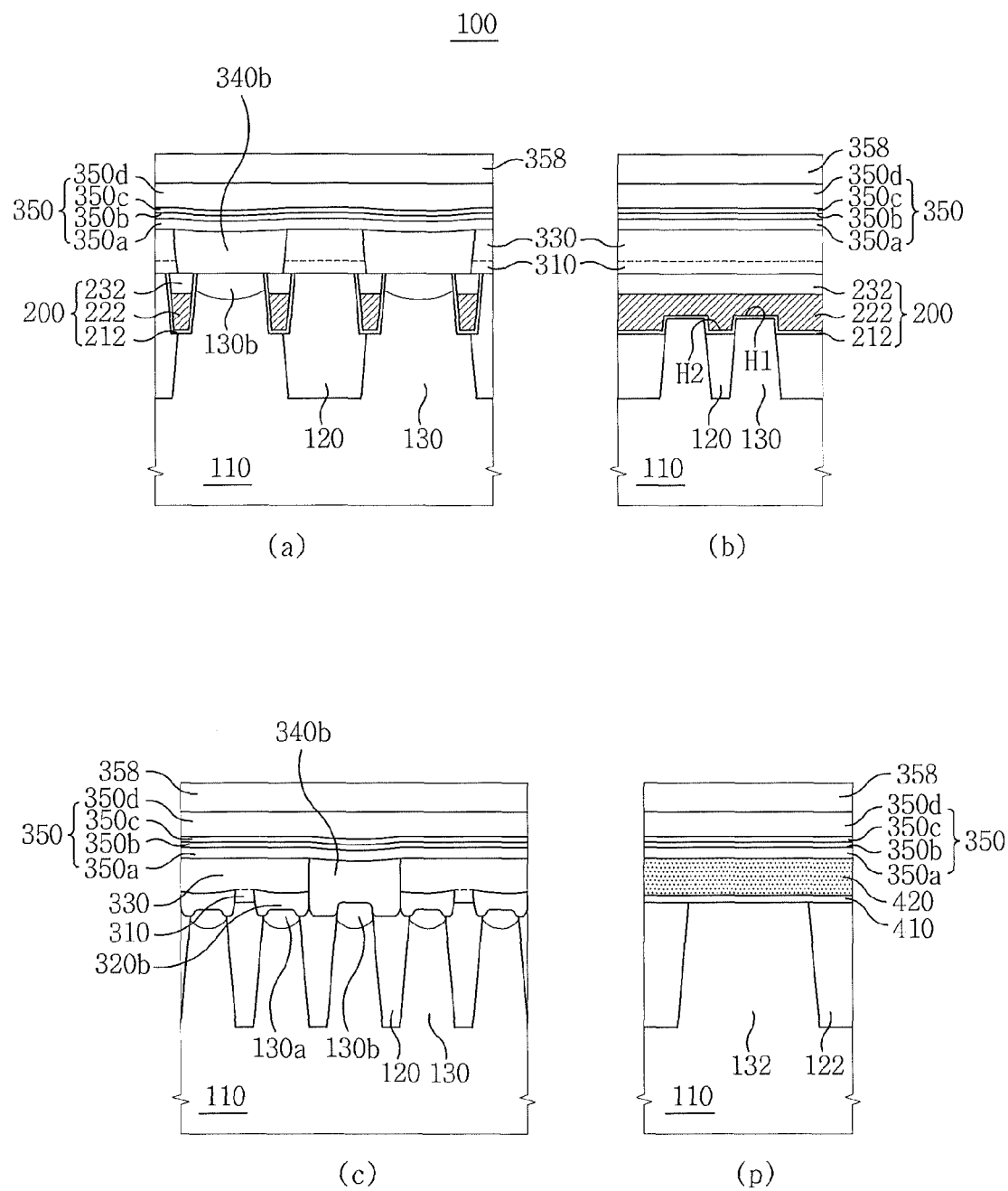
FIGS. 4A through 4Q are longitudinal sectional views illustrating methods of fabricating a semiconductor device according to some embodiments of the inventive concept.

Referring to FIG. 4I, a deposition process may be performed on both the cell area CA and the peripheral area PA, thereby forming a lower metal silicide layer 350a, a barrier layer 350b, an upper metal silicide layer 350c, an electrode layer 350d, and a hard mask layer 358 on the entire surface of the second interlayer insulating layer 330.

Referring to FIG. 4J, a third photoresist pattern 352 may be formed on the hard mask layer 358 using a third photolithography process.

Referring to FIG. 4K, a bit line hard mask pattern 364 may be formed in the cell area CA, and a peripheral gate hard mask pattern 464 may be formed in the peripheral area PA.

Referring to FIG. 4L, the electrode layer 350d, the upper metal silicide layer 350c, the barrier layer 350b, and the lower metal silicide layer 350a may be selectively removed using the bit line hard mask pattern 364 as an etch mask. Thus, a bit line lower metal silicide pattern 360a, a bit line barrier pattern 360b, a bit line upper metal silicide pattern 360c, a bit line electrode pattern 360d, and the bit line hard mask pattern 364 may be sequentially formed in the cell area CA. Also, the same patterning process may be performed in the peripheral area PA using the peripheral gate hard mask pattern 464 as an etch mask. Thus, a peripheral gate insulating layer 410, a first peripheral gate conductive pattern 422, a peripheral gate lower metal silicide pattern 460a, a peripheral gate barrier pattern 460b, a peripheral gate upper metal silicide pattern 460c, and a peripheral gate electrode pattern 460d may be sequentially formed in the peripheral area PA. In this case, the peripheral storage contact pad 320b may be separated from the peripheral bit line contact plug 340b, the peripheral bit line contact plug 340b may become a bit line contact plug 340c, and the peripheral storage contact pad 320b may become a storage contact pad 320c.

Referring to FIG. 4M, a spacer insulating layer 370 may be formed on the substrate 110 in both the cell area CA and the peripheral area PA.

Referring to FIG. 4N, bit line spacers 380 may be formed on both sidewalls of the bit line hard mask pattern 364, the bit line conductive pattern 360, and the preliminary bit line contact plug 350b, while peripheral gate spacers 480 may be formed on both sidewalls of the peripheral gate hard mask pattern 464, the second peripheral gate conductive pattern 460, and the second peripheral gate conductive pattern 460. Also, an ion implantation process may be performed on the peripheral area PA using the peripheral gate spacer 480 as an ion implantation mask, thereby forming an impurity region 134 in the peripheral active region 132.

Referring to FIG. 4O, a third interlayer insulating layer 374 may be formed to cover the bit line 300 and the peripheral gate 400.

Referring to FIG. 4P, a portion of the third interlayer insulating layer 374 may be removed, thereby forming a storage contact hole 376.

Referring to FIG. 4Q, a conductive material may be formed to fill the storage contact hole 376, and then planarized, thereby forming a storage contact plug 390.

FIGS. 5A through 5Q are longitudinal sectional views illustrating a method of fabricating a semiconductor device according to embodiments of the inventive concept. Each of the FIGS. 5A through 5Q shows longitudinal sectional views taken along lines A-A', B-B', and C-C' of FIG. 1A and line P-P' of FIG. 1B.

Referring to FIGS. 1A, 1B, and 5A, a buried-transistor forming process may be performed in a substrate 110 of a cell area CA. An STI forming process may be performed in the substrate 110 so that a cell isolation region 120 defining a cell active region 130 and a peripheral isolation region 122 defining a peripheral active region 132 can be formed in the cell area CA and a peripheral area PA, respectively. A recess process and a buried-gate forming process may be performed on the substrate 110 of the cell area CA, thereby forming a cell gate insulating layer 212, a cell gate conductive pattern 222, and a cell gate capping pattern 232. A cell source region 130a and a cell drain region 130b may be formed using an ion implantation process.

Referring to FIG. 5B, a first interlayer insulating layer 310 may be formed on a top surface of the substrate 110 in both the cell area CA and the peripheral area PA. For example, an insulating material may be deposited on the entire surface of the substrate 110, thereby forming the first interlayer insulating layer 310 to a first thickness T1. Subsequently, to open the first interlayer insulating layer 310 corresponding to the cell source region 130a, a first photoresist pattern 312 may be formed using a first photolithography process.

Referring to FIG. 5C, a portion of the first interlayer insulating layer 310 may be selectively removed, thereby forming a first hole 320a. Thus, the cell source region 130a may be exposed. Thereafter, the first photoresist pattern 312 may be removed.

Referring to FIG. 5D, a preliminary storage contact pad 320b may be formed to directly contact the cell source region 130a. For example, a conductive material, such as a heavily-doped poly-Si material, may be deposited on the entire surface of the first interlayer insulating layer 310 to fill the first hole 320a, and then planarized using a CMP process until a top surface of the first interlayer insulating layer 310 is exposed.

Referring to FIG. 5E, an insulating material, such as silicon oxide, may be deposited again on the first interlayer insulating layer 310 including the preliminary storage contact pad 320b, and then partially removed using a planarization process, thereby forming a second interlayer insulating layer 330 to a second thickness T2.

Referring to FIG. 5F, a second photoresist pattern 332 may be formed using a second photolithography process. The second photoresist pattern 332 may be provided to open the first and second interlayer insulating layers 310 and 330 corresponding to the cell drain region 130b.

Referring to FIG. 5G, the first and second interlayer insulating layers 310 and 330 may be etched using the second photoresist pattern 332 as an etch mask, thereby forming a second hole 340a exposing a portion of the cell drain region 130b. Thus, a second interlayer insulating layer 330 exposing the portion of the cell drain region 130b may be formed.

Meanwhile, a peripheral gate insulating layer 410 may be formed in the peripheral area PA. By partially removing the first and second interlayer insulating layers 310 and 330, the peripheral gate insulating layer 410 may be formed to a thickness of about 50 to 150 Å. In some embodiments, the gate insulating layer 410 may be formed using an additional thermal oxidation process.

Referring to FIG. 5H, a preliminary bit line contact plug 340b may be formed to directly contact the cell drain region 130b. For example, a conductive material may be formed on the entire surface of the second interlayer insulating layer 330 to fill the second hole 340a, and then planarized until a top surface of the second interlayer insulating layer 330 is exposed. The conductive material may include a heavily-doped poly-Si material or a metal material. Thus, the preliminary storage contact pad 320b may directly contact the preliminary bit line contact plug 340b.

Meanwhile, a first peripheral gate conductive layer 420 may be formed in the peripheral area PA. The first peripheral gate conductive layer 420 may be formed of the same material using the same process as the preliminary bit line contact pad 340b. The first peripheral gate conductive layer 420 may be formed using doped silicon. Here, the doped silicon may be heavily doped with impurities and/or further include C as compared with the preliminary bit line contact plug 340b. In this case, the impurities and/or C may be implanted using an open mask (not shown) configured to open the peripheral area PA.

Furthermore, subsequent processes including a deposition process of forming a lower metal silicide layer 350a, a barrier layer 350b, an upper metal silicide layer 350c, an electrode layer 350d, and a hard mask layer 358 may be the same as the processes of FIGS. 4I through 4Q, and thus a description thereof will be omitted.

Figure 6A:
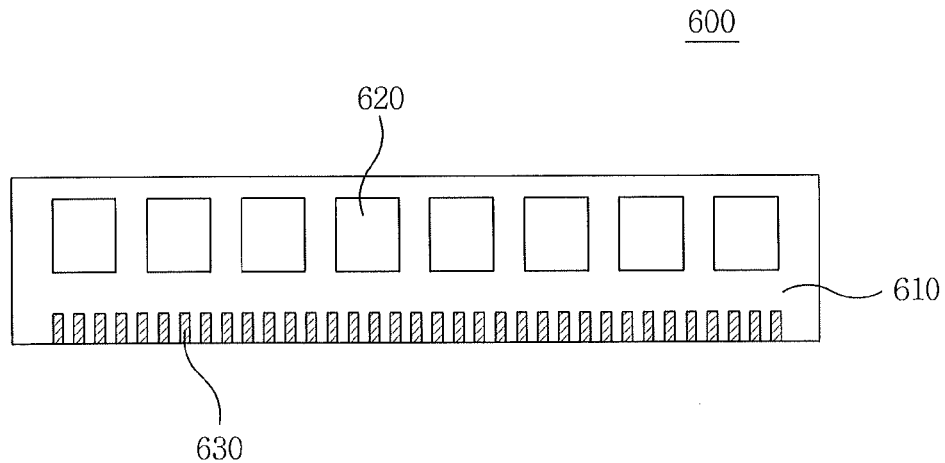
FIGS. 6A through 6C are block diagrams of a semiconductor module, an electronic circuit substrate, and an electronic system including various semiconductor devices according to some embodiments of the inventive concept.
Figure 6B:
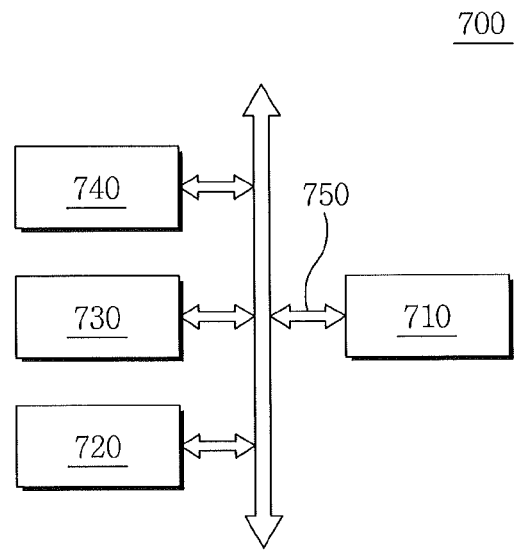
Figure 6C:
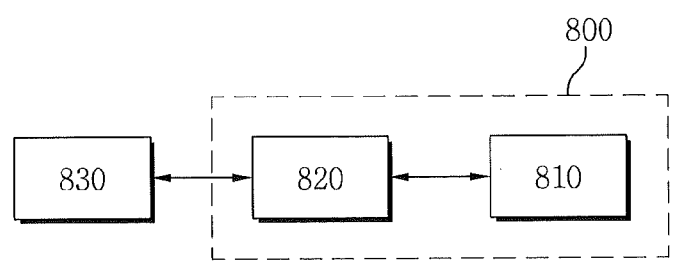

FIGS. 6A through 6C are block diagrams of a semiconductor module, an electronic system, and a memory card including various semiconductor packages according to embodiments of the inventive concept. Referring to FIG. 6A, the above-described semiconductor device 100 may be applied to a semiconductor module 600 including various kinds of semiconductor devices. The semiconductor module 600 may include a module substrate 610, semiconductor integrated-circuit (IC) chips 620 mounted on the module substrate 610, and module contact terminals 630 formed in a row on one side of the module substrate 610 and electrically connected to the semiconductor IC chips 620. The semiconductor IC chips 620 may be semiconductor IC chips to which semiconductor device techniques according to embodiments of the inventive concept are applied. The semiconductor module 600 may be connected to an external electronic apparatus through the module contact terminals 630.

Referring to FIG. 6B, the above-described semiconductor device 100 may be applied to an electronic system 700. The electronic system 700 may include a controller 710, an input/output (I/O) device 720, and a memory device 730. The controller 710, the I/O device 720, and the memory device 730 may be merged with one another through a bus 750 configured to provide a data transmission path. The controller 710 may include at least one of microprocessors (MPs), digital signal processors, microcontrollers, and logic devices capable of similar functions thereto. Each of the controller 710 and the memory device 730 may include at least one semiconductor device 100 according to embodiments of the inventive concept. The I/O device 720 may include at least one selected from the group consisting of a keypad, a keyboard, and a display device. The memory device 730 may store data and/or commands to be executed by the controller 710. The memory device 730 may include a volatile memory device, such as a dynamic random access memory (DRAM), and/or a nonvolatile memory device, such as a flash memory device. For example, a flash memory device may be mounted on a data processing system, such as a mobile device or a desktop computer. The flash memory may include a semiconductor disk device (SSD).

The electronic system 700 may further include an interface 740 configured to transmit data to a communication network or receive data from the communication network. The interface 740 may be a wired/wireless type. For example, the interface 740 may include an antenna or a wired/wireless transceiver. The electronic system 700 may be embodied by a mobile system, a personal computer (PC), an industrial computer, or a multifunctional logic system. For example, the mobile system may be any one selected from the group consisting of a personal digital assistant (PDA), a portable computer, a web tablet, a mobile phone, a wireless phone, a laptop computer, a memory card, a digital music system, and a data transmission/receiving system.

Referring to FIG. 6C, the above-described semiconductor device 100 according to embodiments of the inventive concept may be provided as the type of a memory card 800. For example, the memory card 800 may include a nonvolatile memory device 810 and a memory controller 820. The nonvolatile memory device 810 and the memory controller 820 may store data or read stored data. The nonvolatile memory device 810 may include at least one of nonvolatile memory devices to which semiconductor device techniques according to embodiments of the inventive concept are applied. The memory controller 820 may control the nonvolatile memory device 810 to read stored data or store data in response to read/write requests of a host 830. In addition, the names and functions of unshown or undescribed components may be easily understood with reference to other drawings of the present specification and descriptions thereof.

As described above, according to a method of fabricating a semiconductor device according to embodiments of the inventive concept, the following effects may be expected. First, in the case of a semiconductor memory device including a 6F2 DRAM cell, although active regions are disposed at an interval of only 1 F, a storage contact pad can be further interposed between the active region and a storage contact plug, thereby increasing a contact area between the active region and the storage contact plug and reducing a contact resistance therebetween. Second, bit line spacers can extend vertically to a substrate and extend horizontally to the storage contact pad so that the bit line spacers can prevent a short failure between a bit line electrode contact plug and a storage contact plug disposed adjacent thereto.

The foregoing is illustrative of embodiments and is not to be construed as limiting thereof. Although some embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device comprising:
a substrate that includes an isolation region that defines a first active region and a second active region;
a bit line contact plug disposed on the first active region of the substrate;
a storage contact pad disposed on the second active region of the substrate;
an interlayer insulating layer disposed on the substrate, the interlayer insulating layer exposing the bit line contact plug and the storage contact pad;
a first bit line structure disposed on the interlayer insulating layer, the first bit line structure including a first bit line conductive pattern and first bit line spacers that cover sidewalls of the first bit line conductive pattern;
a second bit line structure that is disposed on the bit line contact plug and that is substantially parallel to the first bit line structure, the second bit line structure including a second bit line conductive pattern that includes sidewalls that are covered by second bit line spacers; and
a storage contact plug disposed on the storage contact pad, the storage contact plug interposed between the first bit line spacers and the second bit line spacers,
wherein the second bit line spacers expand between the bit line contact plug and the storage contact pad.

2. The device according to claim 1, further comprising a storage electrode that is electrically connected to the storage contact plug.

3. The device according to claim 1, wherein the interlayer insulating layer comprises a first interlayer insulating layer that is disposed on the substrate and a second interlayer insulating layer that is disposed on the first interlayer insulating layer,
wherein the first interlayer insulating layer surrounds sides of the storage contact pad, and
wherein a top surface level of the second interlayer insulating layer is higher than a top surface level of the storage contact pads.

4. The device according to claim 1, wherein a bottom surface level of the first bit line spacers is higher than a bottom surface level of the second bit line spacers.

5. The device according to claim 1, wherein the second bit line spacers each have a first extension that extends in a vertical direction of the substrate to cover sidewalls of the bit line contact plugs and a second extension that extends in a horizontal direction of the substrate.

6. The device according to claim 5, wherein a top surface level of the second extensions is substantially the same as a top surface level of the storage contact pad.

7. The device according to claim 1, further comprising a storage contact electrode that is disposed on the storage contact plug.

8. A semiconductor device comprising:
a substrate including a plurality of isolation regions and a plurality of active regions that are defined by the plurality of isolation regions;
a plurality of gates disposed in the substrate and intersecting ones of the plurality of active regions to define source regions and drain regions in the plurality of active regions;
an interlayer insulating layer disposed on the substrate;

a plurality of bit line contact plugs that penetrate the interlayer insulating layer and contact the drain regions; and a plurality of first bit line structures that are disposed on the interlayer insulating layer;

a plurality of second bit line structures that are disposed on the interlayer insulating layer, wherein the plurality of first bit line structures include first bit line conductive patterns and first bit line spacers that cover sidewalls of the first bit line conductive patterns, and wherein the plurality of second bit line structures include second bit line conductive patterns that contact the plurality of bit line contact plugs and are substantially parallel to the first bit line conductive patterns, and second bit line spacers that cover sidewalls of the second bit line conductive patterns and sidewalls of the bit line contact plugs.

9. The device according to claim 8, wherein ones of the plurality of bit line contact plugs have a first width measured in a first direction of the plurality of gates and a second width measured in a second direction of the second bit line conductive patterns, and wherein the second width is greater than the first width.

10. The device according to claim 8, wherein a bottom surface level of the first bit line spacers is the same as a top surface level of the interlayer insulating layer, and a bottom surface level of the second bit line spacers is lower than a top surface of the interlayer insulating layer.

11. The device according to claim 8, further comprising:
a plurality of storage contact pads disposed on the source regions;
a plurality of storage contact plugs disposed on ones of the plurality of storage contact pads; and
a plurality of storage electrodes disposed on ones of the plurality of storage contact plugs.

12. The device according to claim 11, wherein ones of the plurality of storage contact pads wholly cover respective ones of the source regions and partially cover adjacent isolation regions, and wherein a distance between adjacent storage contact pads is about 60 Å or more.

13. The device according to claim 11, wherein a top surface level of the plurality of storage contact pads is half a height of a top surface level of the plurality of bit line contact plugs relative to the substrate or less.

14. The device according to claim 11, wherein ones of the second bit line spacers include:
first extensions that extend in a vertical direction of the substrate and cover both sidewalls of ones of the plurality of bit line contact plugs; and
second extensions that extend in a horizontal direction of the substrate.

15. The device according to claim 14, wherein the first extensions extend to a top surface of the substrate along the both sidewalls of ones of the plurality of bit line contact plugs and the second bit line spacers electrically insulate the plurality of bit line contact plugs from the plurality of storage contact plugs.

16. The device according to claim 14, wherein the second extensions extend from lower edges of ones of the plurality of bit line contact plugs to adjacent ones of the plurality storage contact pads and the second bit line spacers space ones of the plurality of bit line contact plugs apart from the plurality of storage contact pads and prevent a short between the drain regions and the plurality of storage contact plugs.

17. The device according to claim 11, wherein the interlayer insulating layer includes:
a lower thickness measured between a surface of the substrate and a top surface of a respective one of the plurality of storage contact pads; and
an upper thickness measured between the top surface of the respective one of the plurality of storage contact pads and a top surface of a respective one of the plurality of bit line contact plugs, wherein the upper thickness is greater than the lower thickness.

18. A semiconductor device comprising:
a substrate including a first active region and a second active region defined by an isolation region;
a first interlayer insulating layer disposed on the substrate;
storage contact pads disposed through the first interlayer insulating layer and electrically connected to the first active region;
a second interlayer insulating layer disposed on the first interlayer insulating layer and the storage contact pad;
bit line contact plugs disposed through the first interlayer insulating layer and the second interlayer insulating layer and electrically connected to the second active region;
first bit line electrodes disposed on the second interlayer insulating layer and second bit line electrodes disposed on the bit line contact plugs parallel to the first bit line electrodes;
first bit line spacers disposed on sidewalls of the first bit line electrodes and second bit line spacers disposed on sidewalls of the second bit line electrodes;
storage contact plugs interposed between the first and second bit line spacers and electrically connected to the storage contact pads; and
storage electrodes electrically connected to the storage contact plugs,
wherein a bottom surface level of the second bit line spacers is lower than a bottom surface level of the first bit line spacers, and
wherein the second bit line spacers include first extensions configured to extend to both sidewalls of the bit line contact plugs and second extensions configured to extend in a radial direction from lower edges of the bit line contact plugs in a direction that is substantially parallel to the substrate.

19. The device according to claim 18, wherein the second extensions have a semicircular or semielliptical shape in a top view and contact adjacent storage contact pads, and wherein a top surface level of the second extensions is substantially the same as a top surface level of the storage contact pads.

* * * * *